United States Patent
Li et al.

(10) Patent No.: US 10,811,593 B2
(45) Date of Patent: Oct. 20, 2020

(54) PEROVSKITE RELAXOR-PBTIO$_3$ BASED FERROELECTRIC CERAMICS WITH ULTRAHIGH DIELECTRIC AND PIEZOELECTRIC PROPERTIES THROUGH POLAR NANOREGIONS ENGINEERING

(71) Applicant: The Penn State Research Foundation, University Park, PA (US)

(72) Inventors: Fei Li, State College, PA (US); Dabin Lin, State College, PA (US); Shujun Zhang, State College, PA (US); Thomas R. Shrout, Furance, PA (US); Long-Qing Chen, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 0 days.

(21) Appl. No.: 16/471,282

(22) PCT Filed: Apr. 3, 2018

(86) PCT No.: PCT/US2018/025866
§ 371 (c)(1),
(2) Date: Jun. 19, 2019

(87) PCT Pub. No.: WO2018/187316
PCT Pub. Date: Oct. 11, 2018

(65) Prior Publication Data
US 2020/0098973 A1    Mar. 26, 2020

Related U.S. Application Data

(60) Provisional application No. 62/480,729, filed on Apr. 3, 2017.

(51) Int. Cl.
*H01L 41/257* (2013.01)
*C04B 35/491* (2006.01)
(Continued)

(52) U.S. Cl.
CPC .......... *H01L 41/257* (2013.01); *C04B 35/491* (2013.01); *C04B 41/009* (2013.01);
(Continued)

(58) Field of Classification Search
USPC .............................................. 427/100
See application file for complete search history.

(56) References Cited

U.S. PATENT DOCUMENTS 8,803,264 B1 *    8/2014 Katiyar .............. H01L 29/516
                                                   257/421
2010/0079552 A1    4/2010 Krakawa et al.
(Continued)

OTHER PUBLICATIONS

International Search Report and Written Opinion for PCT/US2018/025866, filed Apr. 3, 2018, dated Jul. 19, 2018.

*Primary Examiner* — Brian K Talbot
(74) *Attorney, Agent, or Firm* — Buchanan Ingersoll & Rooney PC

(57) ABSTRACT

Embodiments of the invention can be directed to controlling and/or engineering the size and/or volume of polar nanoregions (PNRs) of ferroelectric polycrystalline material systems. Some embodiments can achieved this via composition modifications to cause changes in the PNRs and/or local structure. Some embodiments can be used to control and/or engineer dielectric, piezoelectric, and/or electromechanical properties of polycrystalline materials. Controlling and/or engineering the PNRs may facilitate improvements to the dielectric, piezoelectric, and/or electromechanical properties of materials. Controlling and/or engineering the PNRs may further facilitate generating a piezoelectric material that may be useful for many different piezoelectric applications.

12 Claims, 25 Drawing Sheets

(51) Int. Cl.
  *C04B 41/00* (2006.01)
  *C04B 41/45* (2006.01)
  *C04B 41/50* (2006.01)
  *C04B 41/87* (2006.01)
  *H01L 41/187* (2006.01)
  *H01L 41/43* (2013.01)

(52) U.S. Cl.
  CPC ...... *C04B 41/4558* (2013.01); *C04B 41/5041* (2013.01); *C04B 41/87* (2013.01); *H01L 41/1875* (2013.01); *C04B 2235/3249* (2013.01); *C04B 2235/3255* (2013.01); *C04B 2235/768* (2013.01); *H01L 41/43* (2013.01)

(56) References Cited

U.S. PATENT DOCUMENTS

| | | | |
|---|---|---|---|
| 2012/0037839 A1* | 2/2012 | Hackenberger | C30B 11/00 252/62.9 PZ |
| 2013/0015391 A1 | 1/2013 | Lousada Silveirinha Vilarinho et al. | |
| 2013/0168596 A1 | 7/2013 | Zhang et al. | |
| 2013/0270965 A1* | 10/2013 | Hayashi | B41J 2/14233 310/328 |
| 2014/0042574 A1* | 2/2014 | Carman | H01L 41/1875 257/421 |
| 2015/0221858 A1* | 8/2015 | Masai | H01L 41/18 310/311 |

* cited by examiner

PEROVSKITE RELAXOR-PBTIO₃ BASED FERROELECTRIC CERAMICS WITH ULTRAHIGH DIELECTRIC AND PIEZOELECTRIC PROPERTIES THROUGH POLAR NANOREGIONS ENGINEERING

CROSS-REFERENCE TO RELATED APPLICATIONS

This International Application is related to and claims the benefit of priority to International Application No. PCT/US2018/025866 filed on Apr. 3, 2018 and U.S. Provisional Application Ser. No. 62/480,729 filed on Apr. 3, 2017, the entire contents of which are incorporated herein by reference.

STATEMENT REGARDING FEDERALLY SPONSORED RESEARCH AND DEVELOPMENT

This invention was made with government support under Grant No. N00014-16-1-2952 awarded by the United States Navy and under Grant No. DE-FG02-07ER46417 awarded by the Department of Energy. The Government has certain rights in the invention.

FIELD OF THE INVENTION

Embodiments of the invention can be directed to controlling and/or engineering of the size and/or volume of polar nanoregions (PNRs) of ferroelectric material systems. Some embodiments can achieve this via composition modifications to cause changes in the PNRs and/or local structure.

BACKGROUND OF THE INVENTION

Examples of conventional piezoelectric systems can be understood from U.S. 2003/0031622 by Eitel et al., U.S. 2005/0109263 by Chiang et al., U.S. 2011/0017937 by Luo et al., U.S. 2012/0009361 by Cohen et al., U.S. 2013/0168596 by Zhang et al., U.S. 2013/0270965 by Hayashi et al., and *Piezoelectric and Acoustic Materials for Transducer Applications* (2008. A. L. Kholkin, N. A. Pertsev, and A. V. Goltsev).

Conventional piezoelectric system may be limited to morphotropic phase boundary (MPB) composition modifications when attempting to improve the dielectric, piezoelectric, and/or electromechanical properties. Such techniques may only generate medium improvements in dielectric, piezoelectric, and/or electromechanical properties. Some other approaches to increase dielectric, piezoelectric, and/or electromechanical properties via polymorphic phase boundary modifications and/or donor dopant strategies can lead to unstable properties or increased dielectric and/or mechanical losses.

SUMMARY OF THE INVENTION

Embodiments of the invention can be directed to controlling and/or engineering the size and/or volume of polar nanoregions (PNRs) of ferroelectric material systems. Some embodiments can achieve this via composition modifications to cause changes in the PNRs and/or local structure. This may be done to improve dielectric, piezoelectric, and/or electromechanical properties of materials. This can include generating piezoelectric ceramic compositions that may be suitable for high performance electromechanical applications, such as actuators, piezoelectric sensors, and ultrasonic transducers.

In at least one embodiment, a method for generating a piezoelectric system can involve preparing a ferroelectric polycrystalline material having a Perovskite crystalline structure having at least one end member. The method can involve ensuring the at least one of end member comprises a relaxor component with a polarized nanoregion (PNR). The method can involve modifying size and volume of the PNR via composition modifications.

In some embodiments, the preparing the ferroelectric polycrystalline material can involve preparing a relaxor-based ferroelectric polycrystalline material including a $Pb(MI,MII)O_3$ Perovskite structure. In some embodiments, the modifying the size and the volume of the PNR further can involve doping the ferroelectric material at an A-site and/or a B-site of the $Pb(MI,MII)O_3$ Perovskite structure. In some embodiments, the preparing the ferroelectric polycrystalline material can involve preparing at least one of a binary and ternary ferroelectric material system.

In some embodiments, the preparing the ferroelectric material can involve preparing a relaxor-based ferroelectric material including a general formula $Pb_{1-x}M_x[(MI,MII)]_{1-y}Ti_yO_3$ and/or $Pb_{1-2x/3}M_x[(MI,MII)]_{1-y}Ti_yO_3$. In some embodiments, M can be a rare earth cation. In some embodiments, M can be at least one of $La^{3+}$, $Ce^{3+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, $Lu^{3+}$. In some embodiments, MI can be at least one of $Mg^{2+}$, $Zn^{2+}$, $Ni^{3+}$, $Yb^{3+}$, $Sc^{3+}$, $In^{3+}$, $Co^{3+}$, $Fe^{3+}$, In some embodiments, MII can be at least one of $Nb^{5+}$, $Ta^{5+}$. In some embodiments, $0<x<0.05$. In some embodiments, $0.02<y<0.7$.

In some embodiments, the preparing the ferroelectric polycrystalline material can involve preparing a relaxor-based ferroelectric material including a general formula $(Pb,Bi)_{1-x}M_x[(MI,MII)O_3]_{1-y}Ti_yO_3$. In some embodiments, M can be a rare earth cation. In some embodiments, M can be at least one of $La^{3+}$, $Ce^{3+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, $Lu^{3+}$. In some embodiments, MI can be at least one of $Mg^{2+}$, $Zn^{2+}$, $Ni^{3+}$, $Yb^{3+}$, $Sc^{3+}$, $In^{3+}$, $Co^{3+}$, $Fe^{3+}$, $Ga^{3+}$. In some embodiments, MII can be at least one of $Ti^{4+}$, $Zr^{4+}$, $Hf^{4+}$, $Sn^{4+}$, $Nb^{5+}$, $Ta^{5+}$, $W^{6+}$. In some embodiments, $0<x<0.05$.

In some embodiments, $0.02<y<0.7$. In some embodiments, the piezoelectric system can have a free dielectric constant $>7,000$, a clamped dielectric constant $\geq 2,500$, a piezoelectric coefficient $d_{33}s \geq 1000$ pC/N, and coupling factor $k_{33}=0.76\sim0.80$. In some embodiments, the piezoelectric system can have a piezoelectric coefficient $d_{33} \geq 1500$ pC/N. In some embodiments, the piezoelectric system can have a piezoelectric coefficient $d_{33} \geq 1100$ pC/N, a free dielectric constant $>10000$, a coupling factor $k_{33} \geq 0.78$, and a phase transition temperature $>80°$ C. In some embodiments, the piezoelectric system can have an electric field induced piezoelectric coefficient $d_{33}^* \geq 1200$ pC/N at an applied electric field $>2$ kV/cm.

In some embodiments, the ensuring the at least one of end member includes a relaxor component can involve ensuring the temperature of the ferroelectric polycrystalline material is above the Burns temperature so as to generate at least one randomly orientated PNR. The method can further involve applying a polarization treatment to the ferroelectric polycrystalline material.

In some embodiments, the method can further involve causing the PNR to form a collinear state with an adjacent matrix of the ferroelectric polycrystalline material.

In some embodiments, the method can involve making use of the interfacial energies between rhombohedral and tetragonal PZT layers to enhanced piezoelectricity in PZT superlattices of the ferroelectric polycrystalline material.

Further features, aspects, objects, advantages, and possible applications of the present invention will become apparent from a study of the exemplary embodiments and examples described below, in combination with the Figures, and the appended claims.

BRIEF DESCRIPTION OF THE DRAWINGS

The above and other objects, aspects, features, advantages and possible applications of the present innovation will be more apparent from the following more particular description thereof, presented in conjunction with the following drawings. Like reference numbers used in the drawings may identify like components.

FIG. 12 denotes the angle (degrees) between the polar vector and the y direction with polar vectors shown along the y direction, and polar vectors shown along the x y and xy directions, respectively.

FIGS. 22-23 show temperature-dependent dielectric properties of an embodiment of a 2.5Sm-PMN-31PT and PMN-36PT ceramic, wherein FIG. 22 shows relative dielectric permittivity and FIG. 23 shows loss factor. The data were measured at 1 kHz.

DETAILED DESCRIPTION OF THE INVENTION

Figure 1:
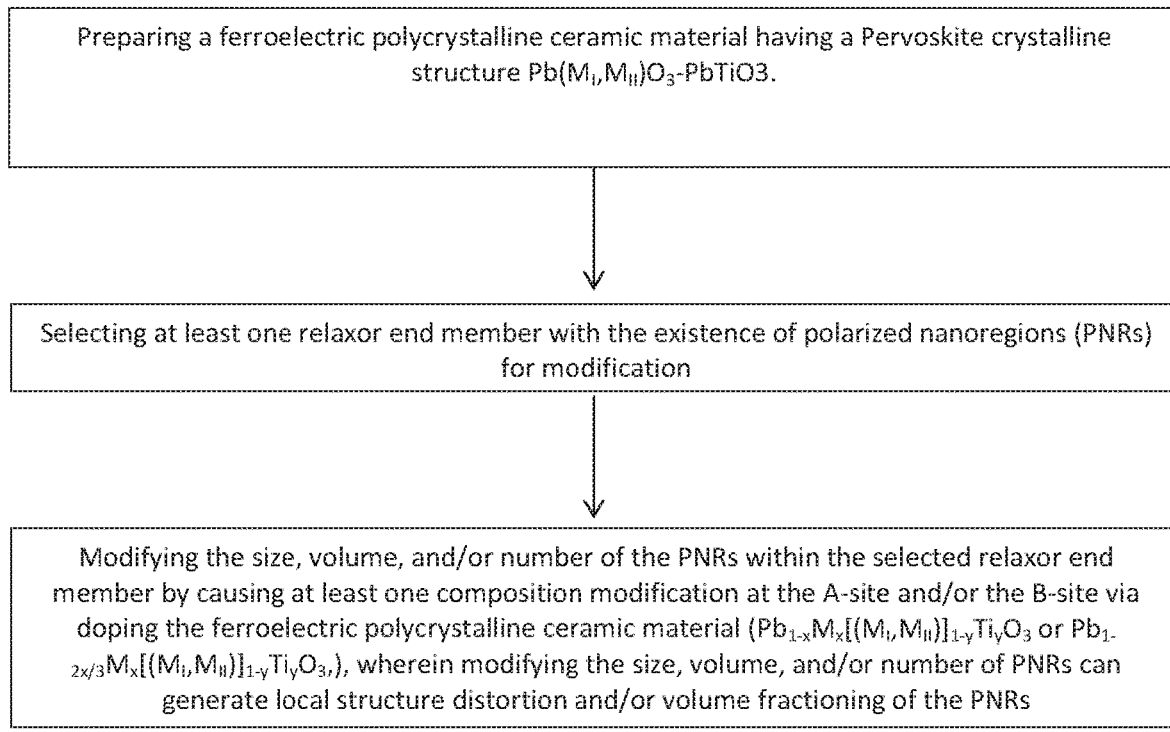
FIG. 1 shows a flow diagram for an exemplary method for generating a piezoelectric system.

The following description is of exemplary embodiments that are presently contemplated for carrying out the present invention. This description is not to be taken in a limiting sense, but is made merely for the purpose of describing the general principles and features of the present invention. The scope of the present invention is not limited by this description.

Embodiments disclosed herein can include a material that can be configured to have a piezoelectric, a dielectric, and/or an electromechanical property. In some embodiments, the material can be included in a device or other type of apparatus. Some devices can include a plurality of materials. For instance, an exemplary apparatus can be configured as a piezoelectric system or piezoelectric device having at least one embodiment of the material. In some embodiments, the device can be a piezoelectric sensor, a piezoelectric transducer, a piezoelectric generator, a piezoelectric actuator, etc. Some embodiments of the apparatus can be configured for generating a material for piezoelectric devices that may be suitable for high performance electromechanical applications.

Embodiments of the material may include a ceramic. Embodiments of the material may be configured to include a Perovskite crystalline structure. A Perovskite crystalline structure can include a general chemical formula of $^{XII}A^{2+VI}B^{4+}X^{2-}_3$, where A and B may be cations and X may be oxygen. An exemplary Perovskite ceramic can be lead titanate ($PbTiO_3$), for example. The lattice structure of a Perovskite material can include cubic, orthorhombic, tetragonal, monoclinic, rhombohedral, etc. The oxygen may be located at the face centers of the lattice. The size and/or valence of the A and/or B ions can be changed or controlled to generate distortions and/or introduce instability in the crystalline structure. Some embodiments of the material can include a ferroelectric property. For example, the material can exhibit a polarization that may be modifiable due to an application of an electric filed (E-field).

Some embodiments of the material can include a binary system or a binary mixture of substances. Some embodiments of a material can include a ternary system or a ternary mixture of substances. Some embodiments of the material can be configured as a binary and/or ternary system. Some embodiments of the material may be configured to include a morphotropic phase boundary (MPB). Some embodiments of the material may be configured to include rhombohedral and/or tetragonal ferroelectric phases. Embodiments of a piezoelectric device may include any one and/or combination of the materials and/or systems described herein.

Some embodiments of the material may be configured to include a relaxor-based ferroelectric structure. An example can be a relaxor-lead titanate based ferroelectric structure, which may have a general formula of $Pb(M_I,M_{II})O_3$—$PbTiO_3$. $Pb(M_I,M_{II})O_3$ may be referred to as a relaxor end member. As will be explained in detail, the inventive method can be used to generate other formulations. For example, a general formula of embodiments of the material can include $Pb_{1-x}M_x[(M_I,M_{II})]_{1-y}Ti_yO_3$ ("General Formula I") and/or $Pb_{1-2x/3}M_x[(M_I,M_{II})]_{1-y}Ti_yO_3$ ("General Formula II"). In the general formulas, Pb can be referred to as A-site. $(M_I,M_{II})$ and/or Ti can be referred to as B-sites. The $M_I$ may be a low valance cation. The $M_{II}$ may be a high valance cation.

The $(M_I,M_{II})$ portion may generate a relaxor component. Relaxor components can include polarized nanoregions (PNRs). PNRs can be formed by causing a nanoscale local region to have a dominant structure with spontaneous polarizations different from a nearby matrix of the material. The spontaneous polarization regions may be with a range from several nanometers to several tens nanometers. Exemplary materials with PNRs may include lead lanthanum zirconate titanate (PLZT), lead magnesium niobate (PMN), lead zinc niobate (PZN), PMN-lead titanate ($PbTiO_3$) solid solution, lead barium metaniobate (PBN), $Na_{1/2}Bi_{1/2}O_3$ (NBT), etc. Exemplary relaxor-based ferroelectric materials with Perovskite structures can include PMN, PMN-PT, etc.

As aspect of the method can include use of composition modifications. This may be done to tailor the composition of the material in order to change a characteristic of the PNR. This may include changing the size, volume, and/or number of PNRs. An increase in the number of PNRs can lead to improved material properties. Composition modifications can be achieved via doping. For example, doping strategies can be used to at least partially replace and/or change the A-site cation and/or the B-site cation. Using the general formulas of $Pb_{1-x}M_x[(M_I,M_{II})]_{1-y}Ti_yO_3$ and/or $Pb_{1-2x/3}M_x[(M_I,M_{II})]_{1-y}Ti_yO_3$ as an example, doping strategies can be used to partially replace Pb with M. $M_I$ and/or $M_{II}$ can also be modified via doping.

Composition modifications may have the effect of controlling and/or engineering the size and/or volume of PNR. This can include controlling and/or engineering the volume ratio of the PNR. For example, a composition modification may cause changes of PNR, changes in PNR size, increases in the number of PNRs, increases in PNR volume fractioning, and/or changes of local structure of an embodiment of a material. This may facilitate inducing and/or changing the volume and/or size of PNRs or local structure that possesses polar vectors different from the nearby matrix and/or macroscopic polarization.

Composition modifications may cause PNRs to be in a collinear state with a ferroelectric matrix of an embodiment of the material. A collinear state can be generated by causing the polar vector of the PNRs to be aligned along the spontaneous polarization of the ferroelectric matrix. For example, the A-site cation (e.g, Pb in the general formulas above) can be partially replaced with a cation (e.g., M in the general formulas above). The ion selected for M may have a coordination number that is the same as Pb. The difference in radius and valence between the M and Pb at the A-site can lead to local un-uniformity in composition, strain, and/or polarization. This may cause the PNRs in the relaxor end member to possess a different polarization from the adjacent matrix of the Perovskite material. The PNRs' polar vector can change, which may depend on the energy competition between the Landau energy of PNRs and the interfacial energies (e.g., strain energy, electrostatic energy, and gradient energy). Based on the Landau energy of PNRs and the interfacial energies, the PNRs polar vector can be caused to align along the spontaneous polarization of the adjacent matrix.

Collinear PNRs may be more prone to rotate in response to external stimuli. The external stimuli may be an applied electric field, a mechanical stress, etc. Rotating PNRs can induce lattice distortion of the nearby matrix, which can be at least one factor that may influence the dielectric, piezoelectric, and/or electromechanical properties of an embodiment of the material and/or piezoelectric device. For example, modifying the size, volume, or number of PNRs can be done to cause local structure distortion and/or volume fractioning of the PNRs. This in turn can allow for the formation of collinear states between the PNRs and the matrix. PNRs in a collinear state with the matrix can be easily rotatable via external stimuli. A piezoelectric device with material having PNRs in a collinear state with the matrix can be beneficial because the PNRs may be easily rotatable via external stimuli. Generally, piezoelectric devices are subjected to external stimuli during operation. Rotating PNRs can induce lattice distortion in the nearby matrix, which can enhance the dielectric and piezoelectric effect. The more easily rotatable the PNRs are, the easier the lattice distortion occurs. In other words, the more easily rotatable the PNRs are, the larger the piezoelectric coefficient, electromechanical coupling factor, and/or dielectric constant can be for a piezoelectric device. This can improve efficiency and/or sensitivity of the piezoelectric device.

The PNRs being in a collinear state with the ferroelectric matrix can facilitate rotation of the PNRs due to external stimuli more effectively and more efficiently than conventional systems. A piezoelectric device with an embodiment of the material can exhibit a piezoelectric coefficient, an electromechanical coupling factor, and/or a dielectric constant that are greater than those exhibited by a conventional piezoelectric device under the same conditions.

At least one piezoelectric system can include a binary material system or a ternary material system. For example, the piezoelectric system may include a piezoelectric polycrystalline ceramic. The piezoelectric polycrystalline ceramic may be based on a relaxor-PT composition with a Perovskite $ABO_3$ crystal structure. For example, the relaxor end member may include $Pb(M_I,M_{II})O_3$. $M_I$ can be changed. For example, $M_I$ can be $Mg^{2+}$, $Zn^{2+}$, $Ni^{3+}$, $Yb^{3+}$, $Sc^{3+}$, $In^{3+}$, etc. $M_{II}$ can be changed. For example, $M_{II}$ can be $Nb^{5+}$, $Ta^{5+}$ etc. In some embodiments, the Pb can be at least partially substituted. This may include being substituted with a heterovalent cation. The heterovalent cation may be a rare earth (Re) element or the like, for example. This may be done to modify PNR and/or the local structure of an embodiment of a material included in the piezoelectric system. The piezoelectric polycrystalline ceramic, which may be based on $Pb(M_I,M_{II})O_3$-PT for example, of the system may be configured so that it can be adopted for different uses by modifying and/or engineering PNR. This can include being configured to exhibit a high piezoelectric coefficient, a high dielectric constant (including free dielectric constant and clamped dielectric constant), and/or a high electromechanical coupling factor.

FIG. 1 shows an exemplary method for generating a piezoelectric system. The method can include preparing a ferroelectric polycrystalline ceramic material having a Perovskite crystalline structure. A piezoelectric polycrystalline ceramic material can be generated by a high temperature solid state sintering method. In some embodiments, the ferroelectric material can have at least one relaxor end member with the existence of PNRs. In some embodiments, the relaxor-based ferroelectric material may be configured to include a $Pb(M_I,M_{II})O_3$ with Perovskite structure. This may include $Pb(M_I,M_{II})O_3$—$PbTiO_3$, for example. Other materials can include those with general formulas $Pb_{1-x}M_x[(M_I,M_{II})]_{1-y}Ti_yO_3$ and/or $Pb_{1-2x/3}M_x[(M_I,M_{II})]_{1-y}Ti_yO_3$. The crystalline structure may be rhombohedral, orthorhombic, monoclinic, tetragonal, etc. Some embodiments can include more than one relaxor end member. Any one or multiple relaxor end members can be configured to be the same as or different from any one or combination of other relaxor end members.

The method can include choosing at least one relaxor end member with the existence of PNRs. The method can include modifying the size, volume, and/or number of PNR. In some embodiments, the composition modification can be achieved via doping the ferroelectric material with at least one additive. In some embodiments, the doping can occur at the A-site and/or the B-site. The doping may be done to generate local structure distortion and/or volume fractioning of PNR. The PNR forms a collinear state with a matrix of the ferroelectric material at specific temperature and/or electric field. The specific temperature and/or electric field can depend on the compositions of the material.

Figure 24:
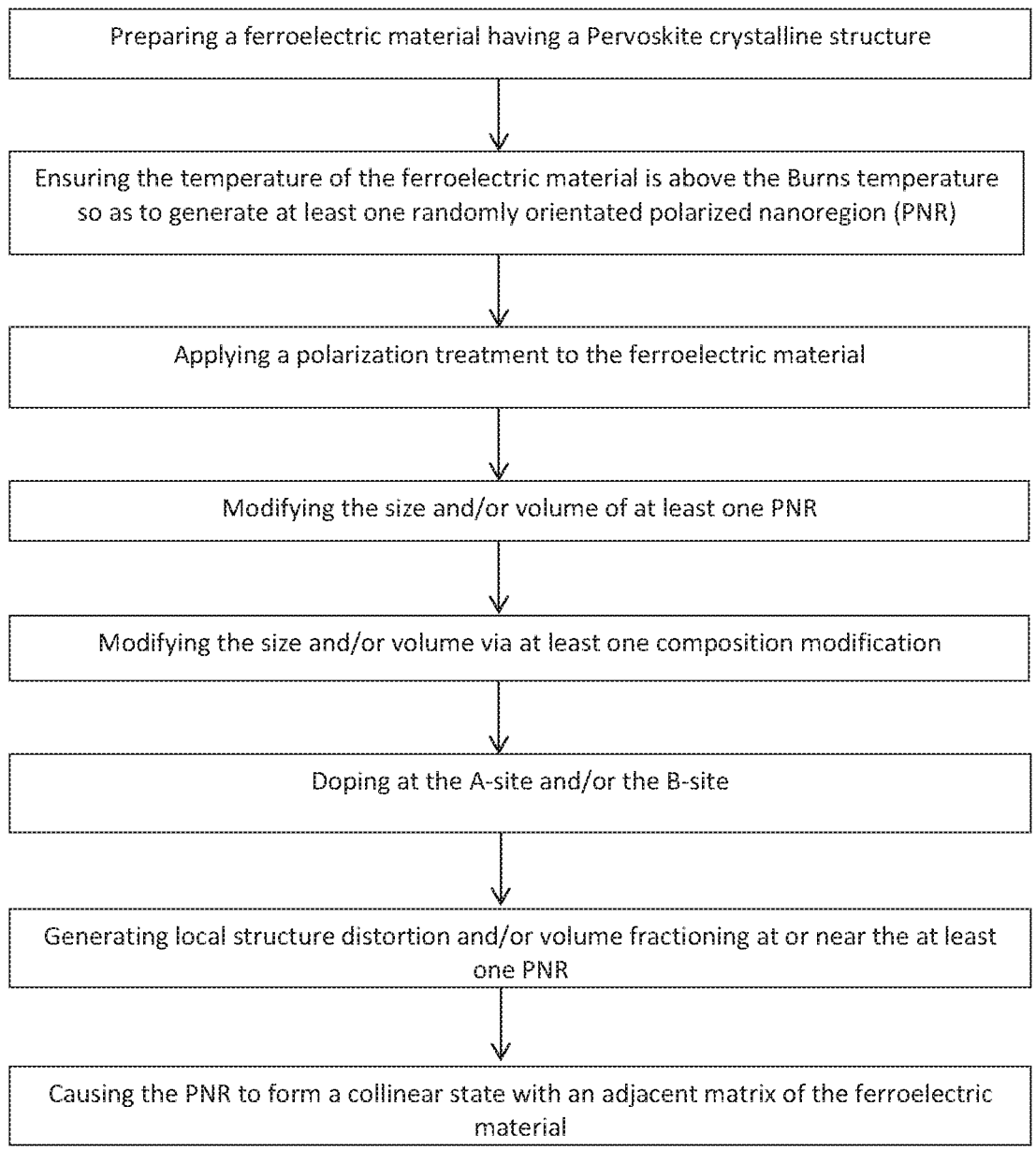
FIG. 24 shows another flow diagram for an exemplary method for generating a piezoelectric system.

An exemplary doping method can include partially replacing an A-site cation, such as Pb, with a rare earth cation as the dopant. The rare earth cation can have a coordinate number of 12, for example. The difference in radius and valence between the dopant (the rare earth cation) and Pb at the A-site can lead to local un-uniformity in composition, strain, and/or polarization. This may cause the PNRs in the relaxor end member to possess a different polarization from the matrix of the Perovskite material. The PNRs' polar vector can change, which may depend on the energy competition between the Landau energy of PNRs and the interfacial energies (strain energy, electrostatic energy, and gradient energy). In some embodiments, the PNRs polar vector can be caused to align along the spontaneous polarization of the matrix. This may be done to generate a collinear state between the PNR and the matrix. For example, some embodiments can be configured such that the PNRs polar vectors begin to switch under the driving force from the nearby matrix when the material is subject to a temperature that is at least 150 Kelvin. At higher temperatures (e.g., room temperature or approximately 295 Kelvin), most of the PNRs may be in a collinear state. This may occur for A-site doped tetragonal relaxor-based $PbTiO_3$, for example, as shown in FIG. 24.

Figure 2:
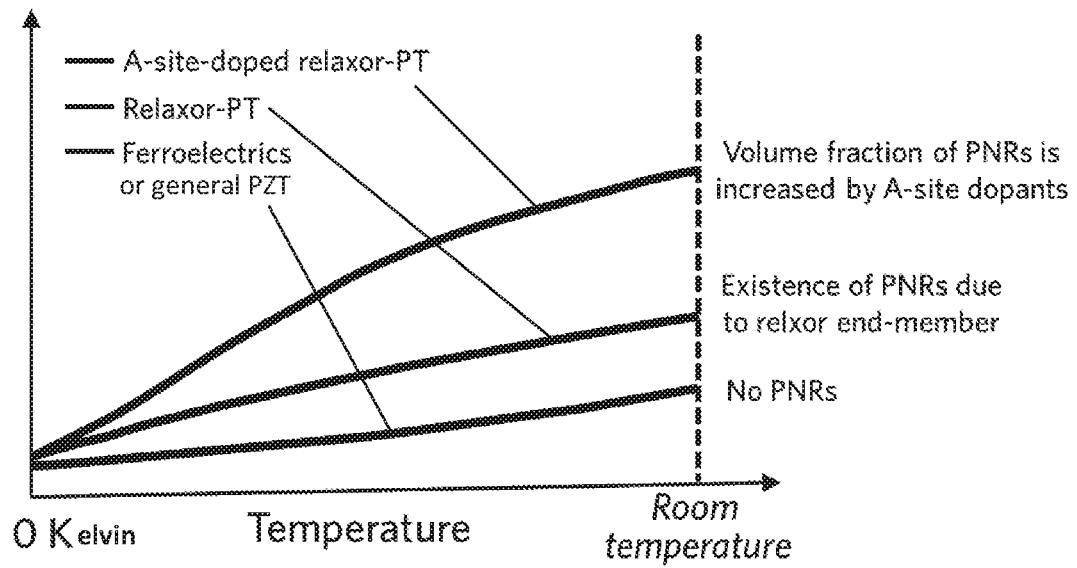
FIG. 2 is a graph showing the temperature dependent dielectric and piezoelectric properties for general lead zirconate titanate (PZT) (annotated as "Ferroelectrics or general PZT" in the Figure), relaxor-PT, and A-site-modified relaxor-PT polycrystalline ceramic (e.g., A-site modified Pb/Bi($M_I$,$M_{II}$)$O_3$-PT) (annotated as "A-site doped relaxor-PT" in the Figure).

FIG. 2 shows the temperature dependent dielectric and piezoelectric properties for general lead zirconate titanate (PZT) (annotated as "Ferroelectrics or general PZT" in the Figure), relaxor-PT, and A-site-modified relaxor-PT polycrystalline ceramic (e.g., A-site modified $Pb(M_I,M_{II})O_3$-PT) (annotated as "A-site doped relaxor-PT" in the Figure). The graph of FIG. 2 shows that A-site modified $Pb(M_I,M_{II})O_3$-PT binary/ternary systems may be configured to possess high dielectric and/or piezoelectric properties compared to those of pure $Pb(M_I,M_{II})O_3$-PT binary/ternary systems. This may be attributed to the local structure distortion and/or existence of high volume fraction of PNR. This may be achieved by any of the composition modifications described herein. FIG. 2 further demonstrates that the dielectric constant of the A-site doped relaxor-PT at room-temperature can be high due to the existence of PNRs.

Any of the doping strategies disclosed herein, including strategies that may lead to local structure distortion and/or existence of high volume fraction PNR, can be referred to herein as PNR engineering and/or PNR controlling.

At least one embodiment can include a PNR engineered binary $Pb(M_I,M_{II})O_3$— $PbTiO_3$ and/or ternary relaxor-PT based piezoelectric polycrystalline material system. The system can include the general formula of $Pb_{1-x}M_x[(M_I,M_{II})]_{1-y}Ti_yO_3$ and/or $Pb_{1-2x/3}Mx[(M_I,M_{II})]_{1-y}Ti_yO_3$. M, at the A-site location, may be doped with additives to modify the size and/or volume of the PNRs. M may be a rare earth cation. Because of the differences of ionic radius and valence between the rare earth cation and the A-site lead cation, local lattice distortion and local polarization can be induced. This may lead to changes in PNR volume and/or changes in the number of PNR. Changes in PNR volume and/or the number of PNR can improve the dielectric, piezoelectric, and/or electromechanical properties of the material. For example, M may include $La^{3+}$, $Ce^{3+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, $Lu^{3+}$, etc. or any combination thereof. $M_I$ may include $Mg^{2+}$, $Zn^{2+}$, $Ni Yb^{3+}$, $Sc^{3+}$, $In^{3+}$, $Co^{3+}$, $Fe^{3+}$, etc. or any combination thereof. $M_{II}$ may include $Nb^{5+}$, $Ta^{5+}$ etc. or any combination thereof. In some embodiments, $0<x\leq0.05$. In some embodiments, $0.02<y<0.7$. In some embodiments, the ternary system may include at least one $Pb(M_I,M_{II})O_3$ end member. The ternary system with one $Pb(M_I,M_{II})O_3$ end member may further include $PbZrO_3/PbHfO_3$, such as $Pb(M_I,M_{II})O_3$—$PbZr(Hf)O_3$— $PbTiO_3$.

At least one embodiment can include a PNR engineered binary/ternary piezoelectric polycrystalline material system. The system can include the formula of $(Pb,Bi)_{1-x}M_x [(M_I, M_{II})O_3]_{1-y}Ti_yO_3$. M may be a rare earth cation. Because of the differences of ionic radius and valence between the rare earth cation and the A-site lead cation, local lattice distortion and local polarization can be induced. This may lead to changes in PNR volume and/or number of PNR. Changes in PNR volume and/or number of PNR can improve the dielectric, piezoelectric, and/or electromechanical properties of the material. For example, M may include $La^{3+}$, $Ce^{3+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, $Lu^{3+}$, etc. or any combination thereof. $M_I$ may include $Mg^{2+}$, $Zn^{2+}$, $Ni^{3+}$, $Yb^{3+}$, $Sc^{3+}$, $In^{3+}$, $Co^{3+}$, $Fe^{3+}$, $Ga^{3+}$, etc. or any combination thereof. $M_{II}$ may include $Zr^{4+}$, $Hf^{4+}$, $Sn^{4+}$, $Nb^{5+}$, $Ta^{5+}$, $W^{6+}$ etc. or any combination thereof. In some embodiments $M_{II}$ can be absent. In some embodiments $0<x\leq0.05$. In some embodiments $0.02<y<0.7$.

In some embodiments, a PNR engineered polycrystalline piezoelectric material can be configured to exhibit a high free dielectric constant, a high clamped dielectric constant, a high $d_{33}$, and/or a high $k_{33}$. For example, the free dielectric constant can be >7,000. The clamped dielectric constant can be $\geq2,500$. The $d_{33}$ can be $\geq1000$ pC/N. The $k_{33}$ can be within a range from 0.76 to >0.80.

In some embodiments, a PNR engineered polycrystalline piezoelectric material can be configured to exhibit a $d_{33}\geq1500$ pC/N.

In some embodiments, a PNR engineered polycrystalline piezoelectric material can be configured to exhibit a $d_{33}\geq1100$ pC/N, a free dielectric constant >10000, a $k_{33}\geq0.78$, and/or a phase transition temperature >80° C.

In some embodiments, a PNR engineered polycrystalline piezoelectric material can be configured to exhibit a high E-field induced piezoelectric coefficient $d_{33}^*\geq1200$ pC/N at >2 kilovolt per centimeter (kV/cm) applied E-field.

A method of preparing an embodiment of the material disclosed herein can include a two-step precursor method. The method may further include synthesizing at least one Columbite precursor and/or Wolframite precursor. The method may further include a batching process. The method may further include a granulating process. The method may further include a pressing process. The method may further include a sintering process.

As a non-limiting example, a Re modified PMN-PT binary ceramic with compositions of $Pb_xRe_{1-x}(Mg_{1/3}Nb_{2/3})_{1-y}Ti_yO_3$ x=0~0.05, y=0.26-0.36) can be prepared using a two-step precursor method. At least one composition can be selected at the proximity of the MPBs in PMN-PT. This may be done to determine and/or validate the impact of the combination of MPB and PNR engineering approaches on the properties of the material.

The method may include synthesizing at least one Columbite precursor and/or Wolframite precursor. This may include synthesizing at 1100° C. For example, raw materials of $MgCO_3$ (99.9%, Alfa Aesar Chemical Manufacturing Co., Ward Hill, Mass. ("Alfa Aesar")) and $Nb_2O_5$ (99.9%, Alfa Aesar) may be used to synthesize Columbite precursors of $MgNb_2O_6$ at 1100° C. for 8 hours.

The method may include batching. This may include batching stoichiometrically. Some embodiments can include wet-milling. This can include wet-milling in alcohol. For example, $Pb_3O_4$ (99%, Alfa Aesar), $MgNb_2O_6$, $TiO_2$ (99.9%, Ishihara Chemical Co., San Francisco, Calif.), and rare earth oxide ($Re_2O_3$, 99.9% (Alfa Aesar) (e.g., $Sm_2O_3$) powders may be batched stoichiometrically. This may be according to the nominal compositions. They may further be wet-milled in alcohol for 24 hours. The powders may be allowed to dry. The powders may be calcinated. For example, the dried mixed powders can be calcined at 800° C. for 4 hours.

The method may include granulating. For example, the synthesized powders may be vibratory milled in alcohol for 12 hours. The powders may then be granulated. The powders may then be pressed into pellets. This can include pressing into pellets, wherein at least one pellet has an approximately diameter of 12 mm.

The method may include sintering. For example, the pellets may be subjected to a binder burnout. This may occur at 550° C. The pellets may then be sintered. This can include sintering in a sealed crucible. This can include sintering at 1250° C. In some embodiments, $PbZrO_3$ may be used as a lead source during the sintering process. This may be done to minimize PbO evaporation.

Figure 3:
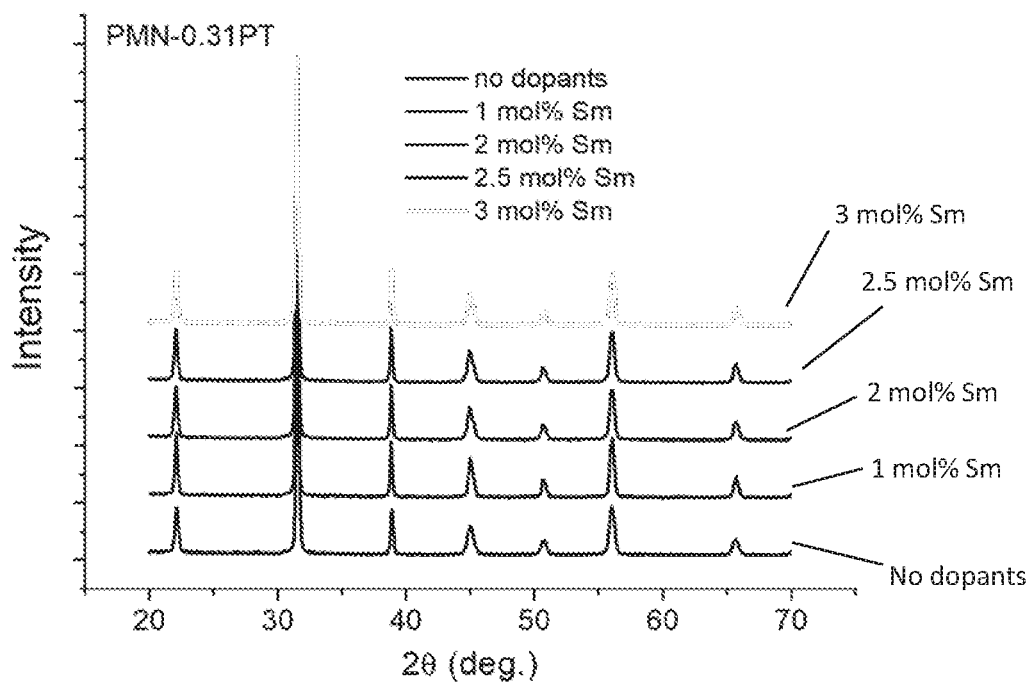
FIG. 3 is a graph showing x-ray diffraction data for a Sm-doped PMN-0.31 PT ceramic.
Figure 4:
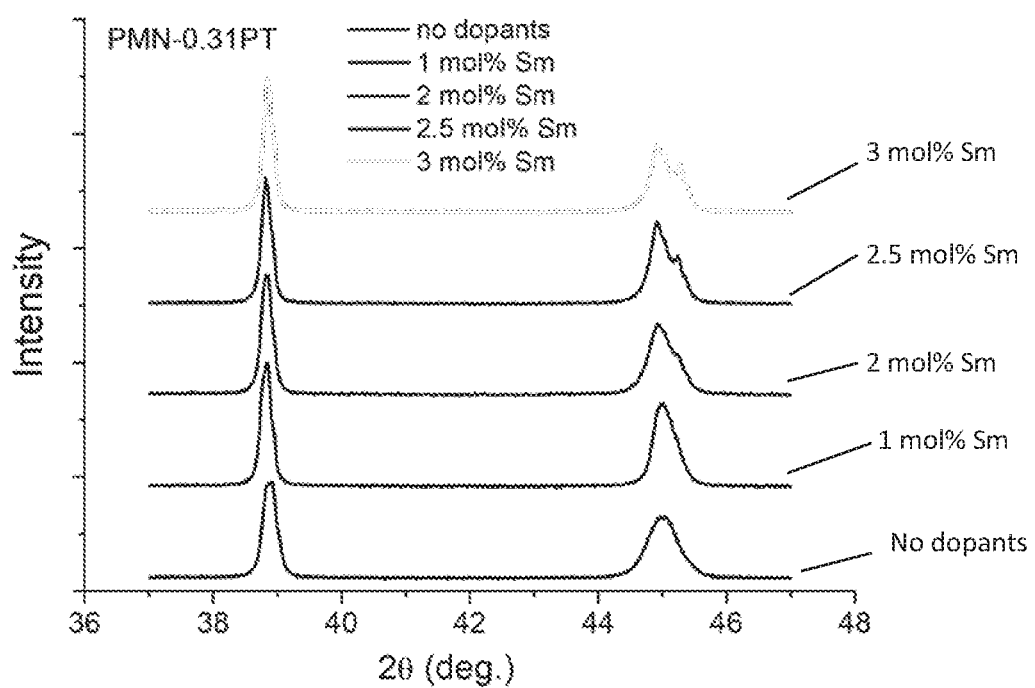
FIG. 4 is a graph showing enlarged x-ray diffraction data (with 2 theta in the range of 37-47 degrees) for a Sm-doped PMN-0.31 PT ceramic.

FIGS. 3 and 4 show X-ray diffraction data for a Sm-doped PMN-0.31 PT ceramic. The results show that the modified PMN-PT binary system can exhibit a pure Perovskite structure without any second phase. It can be seen that Re dopants may benefit tetragonal stability. For example, the peak at 41-45 degrees split into [002] and [200] peaks, demonstrating a tetragonal phase.

Example I

Figure 5:
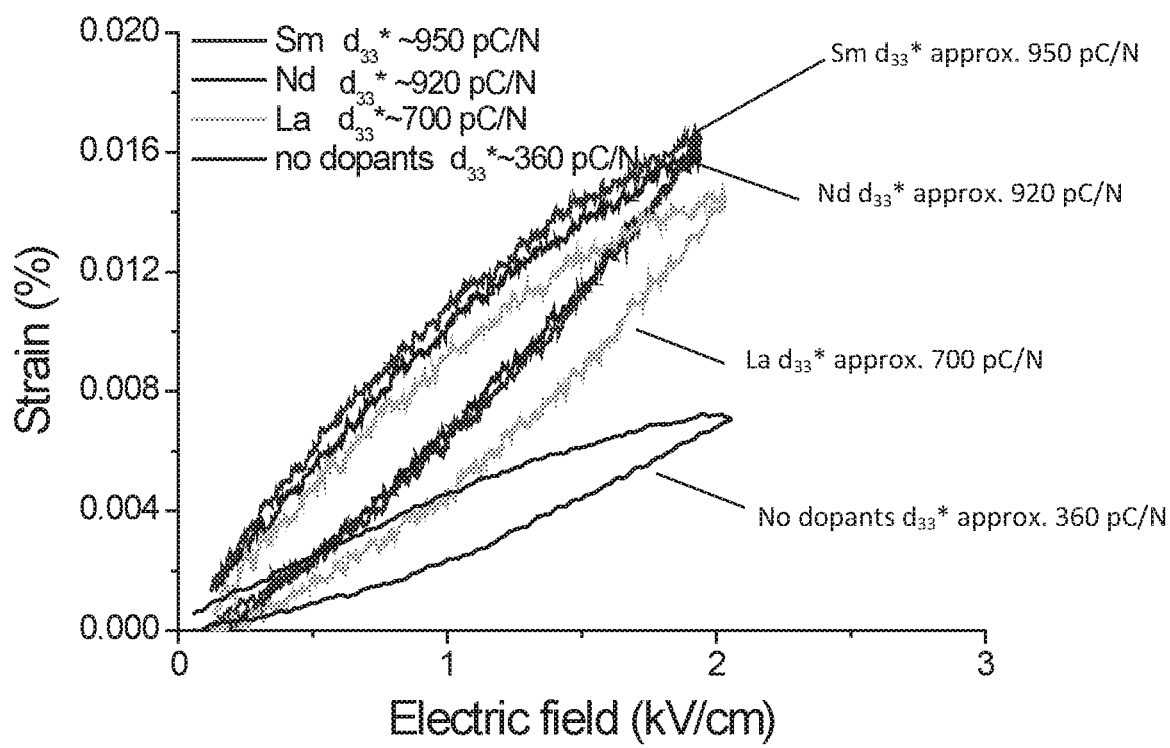
FIG. 5 is a graph showing the E-field-induced strain behavior for various rare earth cation modified PMN-PT binary ceramics.
Figure 6:
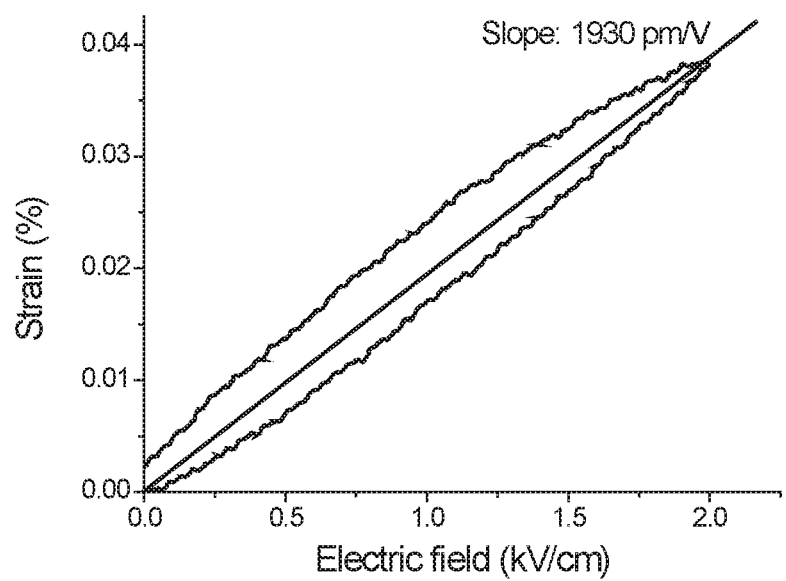
FIG. 6 is a graph showing the E-field-induced strain for A-site-doped PMN-0.29PT ceramic.
Figure 7:
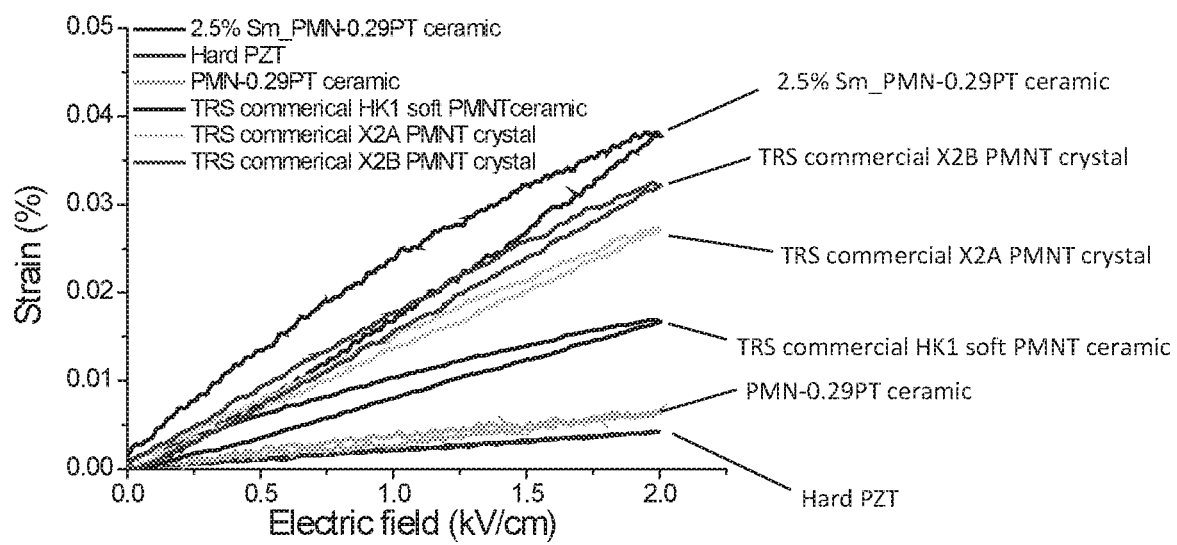
FIG. 7 is a graph showing the E-field-induced strains of hard ceramic (PZT8), soft ceramic (HK1), PMN-0.29PT ceramic, and PMNT crystals compare to Sm doped PMN-0.29PT ceramic.

In some embodiments, PMN-PT ceramics can be configured to exhibit high $d_{33}$ via A-site doping strategies. FIG. 5 shows the E-field-induced strain behavior for various Re modified PMN-PT binary ceramics. The results in FIG. 5 show that the piezoelectric strain coefficient, $d_{33}$, can be enhanced by Re dopants. With optimization techniques (e.g., optimized sintering condition, high density, and MPB composition) ultrahigh piezoelectric coefficients of approximately 1900 picometer per volt (pm/V) can be achieved at 2 kV/cm applied E-field. (See FIG. 6). Optimization techniques can include determining the best conditions for sintering ceramics, such as sintering temperature, sintering time, etc. to achieve high density and high property ceramics. FIG. 7 shows the E-field-induced strain for an embodiment of an A-site doped PMN-PT ceramic, compared to conventional ("commercial") piezoelectric ceramics and conventional PMN-PT crystals. It can be seen that at 2 kV/cm, the E-field-induced strain of A-site doped PMN-PT ceramic may be much higher than conventional piezoelectric ceramics. Furthermore, the E-field-induced strain of A-site doped PMN-PT ceramic may be comparable to conventional PMN-PT single crystals.

Figure 8:
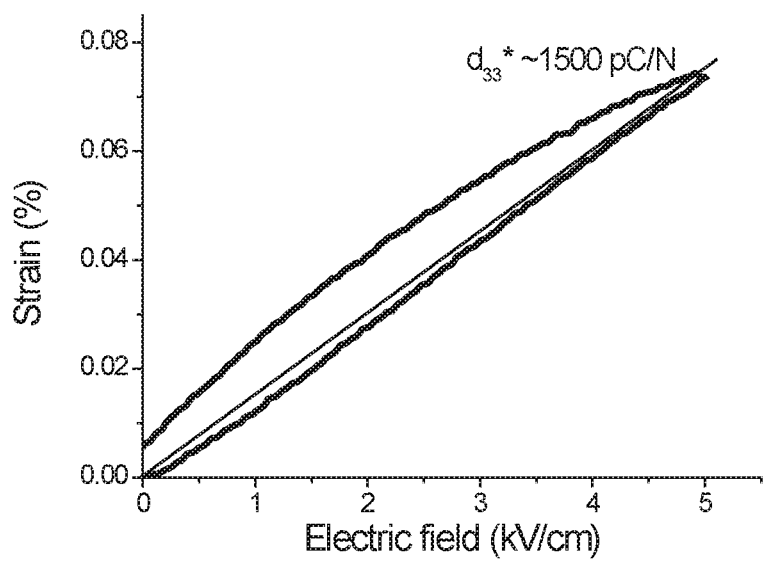
FIG. 8 is a graph showing the electric-field-induced-strains for A-site doped PMN-0.31PT ceramic at an E-field of 5 kV/cm.
Figure 9:
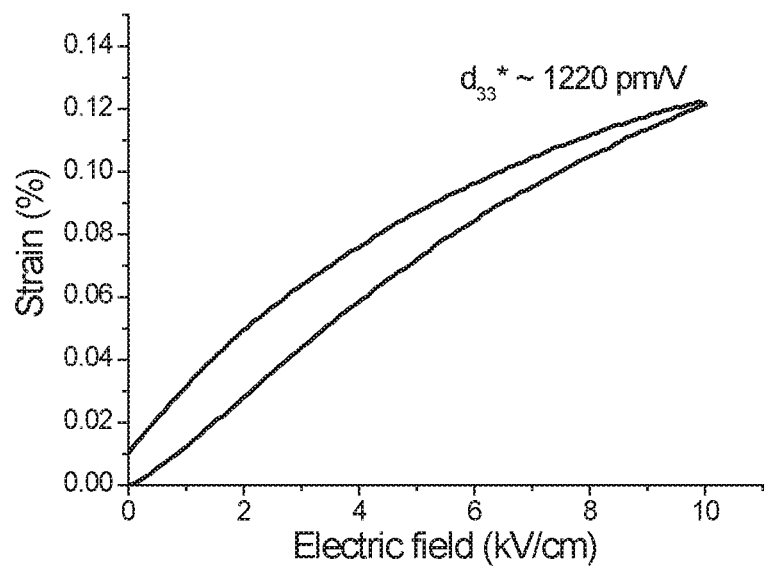
FIG. 9 is a graph showing the electric-field-induced-strains for A-site doped PMN-0.31PT ceramic at an E-field of 10 kV/cm.

FIGS. 8-9 show the E-field-induced strain for A-site modified PMN-PT ceramics at E-field of 5 kV/cm and 10 kV/cm. The piezoelectric strain coefficient $d_{33}^*$ can be 1500 pm/V and 1220 pm/V, respectively.

Example II

In some embodiments, PMN-PT ceramics can be configured to exhibit high dielectric constants and/or high $d_{33}$ via A-site doping strategies. Table I lists the principle properties for A-site modified PMN-PT ceramics, with different A-site dopant levels and PT content, including dielectric constants ($\varepsilon_r$), piezoelectric coefficients ($d_{33}$), electromechanical coupling factors ($k_{33}$), and dielectric loss (tan δ).

TABLE I

Piezoelectric, dielectric and ferroelectric properties of A-site-doped PMN-PT ceramics (e.g., Sm-doped)

|  | $d_{33}$ (pC/N) | $k_{33}$ | $\varepsilon_r$ | tanδ (%) |
|---|---|---|---|---|
| 1% Sm-PMN-0.28PT | 420 | 0.72 | 2500 | 2.0 |
| 1% Sm-PMN-0.29PT | 460 | 0.72 | 2700 | 2.2 |
| 1% Sm-PMN-0.30PT | 560 | 0.73 | 3200 | 2.0 |
| 1% Sm-PMN-0.31PT | 550 | 0.74 | 3300 | 1.8 |
| 1% Sm-PMN-0.32PT | 710 | 0.77 | 4100 | 1.8 |
| 1% Sm-PMN-0.34PT | 780 | 0.76 | 5200 | 1.5 |
| 2% Sm-PMN-0.28PT | 900 | 0.75 | 5100 | 2.5 |
| 2% Sm-PMN-0.29PT | 1050 | 0.77 | 7000 | 2.4 |
| 2% Sm-PMN-0.30PT | 1000 | 0.79 | 8000 | 2.0 |
| 2% Sm-PMN-0.31PT | 1100 | 0.79 | 8300 | 2.0 |
| 2% Sm-PMN-0.32PT | 1050 | 0.80 | 9000 | 1.8 |
| 2% Sm-PMN-0.34PT | 730 | 0.72 | 6300 | 1.8 |
| 2.5% Sm-PMN-0.28PT | 1320 | 0.77 | 12500 | 3.5 |
| 2.5% Sm-PMN-0.29PT | 1510 | 0.78 | 12000 | 2.5 |
| 2.5% Sm-PMN-0.30PT | 1380 | 0.77 | 11000 | 2.5 |
| 2.5% Sm-PMN-0.31PT | 1270 | 0.79 | 10500 | 1.9 |
| 2.5% Sm-PMN-0.32PT | 1000 | 0.74 | 8000 | 1.6 |
| 3% Sm-PMN-0.28PT | 1200 | 0.70 | 15000 | 5.1 |
| 3% Sm-PMN-0.29PT | 1420 | 0.71 | 15000 | 3.8 |
| 3% Sm-PMN-0.30PT | 1250 | 0.72 | 12000 | 2.6 |
| 3% Sm-PMN-0.31PT | 980 | 0.69 | 10000 | 2.0 |

From Table I, it can be observed that $Sm_2O_3$ doped PMN-PT can be configured to possess an enhanced dielectric constant (e.g., 5000-15000). This can be almost 3-5 times higher than that of pure PMN-PT ceramic counterparts. In addition, the clamped dielectric constant can be up to 5000. This can be 3-times higher than that of conventional PZT-5H piezoceramic material systems. A clamped dielectric constant at or near 5000 can be beneficial in applications related to array transducer design and/or electrical impedance matching, for example. Furthermore, the piezoelectric coefficients can be within a range from 900-1500 pC/N. This can be 5-times higher than that of the pure PMN-PT ceramic counterparts. Additionally, a piezoelectric coefficient within a range from 900-1500 pC/N can be comparable to PMN-PT single crystals. Note that piezoelectric coefficients may be measured from small signal measurements using a Berlincourt $d_{33}$ meter. Moreover, the electromechanical coupling factor $k_{33}$ can be as high as 0.80. Even in modified tetragonal PMN-0.34PT ceramics, the dielectric constant may be 6300. The piezoelectric coefficient in modified tetragonal PMN-0.34PT ceramics may be 730 pC/N.

Tables II and III list the properties of conventional or commercially available soft PZT ceramics.

TABLE II

Piezoelectric/dielectric properties of commercial PZT-5A type ceramics

| PZT5A | $d_{33}$ (pC/N) | $k_p$ | $\varepsilon_r/\varepsilon_0$ | tanδ (%) |
|---|---|---|---|---|
| TRS200HD[1] | 400 | 0.66 | 2000 | 1.8 |
| 3195 STD[2] | 350 | 0.63 | 1800 | 1.8 |
| 3295HD[2] | 390 | 0.65 | 1900 | 1.8 |
| PIC255[3] | 400 | 0.62 | 1750 | 2.0 |
| PIC155[3] | 360 | 0.62 | 1450 | 2.0 |
| PKI502[4] | 425 | 0.60 | 2000 | 1.5 |
| PZ23[5] | 328 | 0.52 | 1500 | 1.3 |
| PZ27[5] | 425 | 0.59 | 1800 | 1.7 |
| PZT5A1[6] | 410 | 0.62 | 1875 | 2.0 |
| PZT5A3[6] | 374 | 0.60 | 1700 | 2.0 |

[1]TRS Technologies;
[2]CTS;
[3]PIceramic;
[4]Piezo-kinetics;
[5]Ferroperm;
[6]Morgan.

TABLE III

Piezoelectric/dielectric properties of commercial PZT-5H type ceramics

| PZT5H | $d_{33}$ (pC/N) | $k_p$ | $\varepsilon_r/\varepsilon_0$ | tanδ (%) |
|---|---|---|---|---|
| TRS610HD[1] | 690 | 0.70 | 3900 | 1.8 |
| CTS3203STD[2] | 550 | 0.69 | 3250 | 2.0 |
| CTS3203HD[2] | 650 | 0.70 | 3800 | 2.0 |
| PIC151[3] | 500 | 0.62 | 2400 | 2.0 |
| PIC153[3] | 600 | 0.62 | 4200 | 3.0 |
| PKI532[4] | 490 | 0.63 | 2700 | 2.0 |
| PKI552[4] | 600 | 0.67 | 3400 | 2.2 |
| PZ21[5] | 640 | 0.60 | 3980 | 1.6 |
| PZ29[5] | 570 | 0.64 | 2870 | 1.6 |
| PZT5H1[6] | 620 | 0.60 | 3400 | 1.8 |
| PZT5H2[6] | 590 | 0.65 | 3400 | 2.5 |

[1]TRS Technologies;
[2]CTS;
[3]PIceramic;
[4]Piezo-kinetics;
[5]Ferroperm;
[6]Morgan.

It can be observed that PZT-5A type (Department of Defense (DOD) Type II) ceramics, which may be B-site donor doped (e.g., $Nb^{5+}$ replacing $Ti^{4+}$ in the perovskite structure), show moderate piezoelectric coefficients $d_{33}$s of approximately 400 pC/N. They further exhibit planar coupling factors in the range of 0.5-0.66. Longitudinal dielectric constants can be on the order of 1400-2000. PZT-5H type (DOD Type VI) ceramics, which may be A-site donor doped (e.g., $La^{3+}$ replacing $Pb^{2+}$ on the A-site of the perovskite structure) may exhibit increased piezoelectric properties when compared to PZT-5A type materials, with $d_{33}$ values on the order of 500-700 pC/N and dielectric constants on the order of 2400-3900. PZT-5A and PZT-5H type materials are generally tuned to MPB compositions. Thus, the reported values may be the peak values for such systems. Furthermore, the donor dopants may induce lead vacancies and/or can facilitate domain wall motion. This may account for a large extrinsic contribution to the properties.

Example III

In some embodiments, Re doped ternary systems can be configured to exhibit high piezoelectric coefficients and/or high dielectric constants. Table IV lists the main properties of other relaxor-based ternary systems, such as Re modified $Pb(Mg_{1/3}Nb_{2/3})O_3$—$Pb(Sc_{0.5}Nb_{0.5})O_3$-PT and $Pb(Mg_{1/3}Nb_{2/3})O_3$—$Pb(In_{0.5}Nb_{0.5})O_3$-PT.

TABLE IV

Piezoelectric, dielectric and ferroelectric properties
of Sm-doped PSN-PMN-PT and PIN-PMN-PT ceramics

| | $d_{33}$ (pC/N) | $k_{33}$ | $\varepsilon_r/\varepsilon_0$ | tan$\delta$ (%) |
|---|---|---|---|---|
| 2.5% Sm-0.05PSN-0.65PMN-0.30PT | 1400 | 0.77 | 12000 | 3.2 |
| 2.5% Sm-0.10PSN-0.60PMN-0.30PT | 1300 | 0.77 | 10500 | 3.7 |
| 2.5% Sm-0.15PSN-0.53PMN-0.32PT | 1100 | 0.78 | 7300 | 2.2 |
| 2.5% Sm-0.20PSN-0.47PMN-0.33PT | 950 | 0.78 | 5300 | 2.1 |
| 2% Sm-0.20PSN-0.47PMN-0.33PT | 780 | 0.77 | 4000 | 2.0 |
| 3% Sm-0.20PSN-0.47PMN-0.33PT | 900 | 0.76 | 5100 | 1.5 |
| 2% Sm-0.30PSN-0.36PMN-0.34PT | 700 | 0.75 | 3500 | 2.5 |
| 3% Sm-0.30PSN-0.36PMN-0.34PT | 840 | 0.76 | 4700 | 1.8 |
| 2.5% Sm-0.05PIN-0.65PMN-0.30PT | 1250 | 0.77 | 8200 | 3.1 |
| 2.5% Sm-0.10PIN-0.60PMN-0.30PT | 1200 | 0.78 | 7300 | 3.4 |
| 2.5% Sm-0.15PIN-0.55PMN-0.30PT | 1050 | 0.77 | 8000 | 1.8 |
| 2.5% Sm-0.25PIN-0.45PMN-0.30PT | 830 | 0.75 | 5800 | 4.0 |

Re doped ternary systems may exhibit high piezoelectric coefficients. This may be similarly so in binary systems. For example, the piezoelectric coefficients may be on the order of 700-1400 pC/N. Note that piezoelectric coefficients may be measured from small signal measurements using a Berlincourt $d_{33}$ meter. Furthermore, high dielectric constants on the order of 3500-12000 may be achieved in Re modified $Pb(Mg_{1/3}Nb_{2/3})O_3$—$Pb(Sc_{0.5}Nb_{0.5})O_3$-PT and $Pb(Mg_{1/3}Nb_{2/3})O_3$—$Pb(In_{0.5}Nb_{0.5})O_3$-PT systems.

Additional understanding of the disclosed system and methods of use can be obtained from the article published in Nature Materials titles "Ultrahigh Piezoelectricity in Ferroelectric Ceramics By Design", VOL. 17, April 2018, 349-354, which is available at www.nature.com/naturematerials; https://doi.org/10.1038/s41563-018-0034-4, the entirety of this article is incorporated by reference herein. Piezoelectric materials, which respond mechanically to applied electric field and vice versa, can be an important component for electromechanical transducers. High piezoelectricity in perovskite oxides can be associated with a flat thermodynamic energy landscape connecting two or more ferroelectric phases. With the methods disclosed herein, phenomenological theory and phase-field simulation can be employed to work with morphotropic phase boundaries to further flatten the energy landscape. This can be done by judiciously introducing local structural heterogeneity to manipulate interfacial energies (that is, extra interaction energies, such as electrostatic and elastic energies associated with the interfaces). As noted herein, synthesizing rare-earth-doped $Pb(Mg1/3Nb2/3)O3$-$PbTiO3$ (PMN-PT), as rare-earth dopants can be done to change the local structure of Pb-based perovskite ferroelectrics. This can be done to achieve ultrahigh piezoelectric coefficients d33 of up to 1,500 pC N−1 and dielectric permittivity $\varepsilon 33/\varepsilon 0$ above 13,000 in a Sm-doped PMN-PT ceramic, for example, with a Curie temperature of 89° C. Thus, a novel method is disclosed for designing material properties through engineering local structural heterogeneity.

Ferroelectric crystals possess spontaneous polarization that can be switched by an electric field from one direction to another. Perovskite oxide ferroelectrics can exhibit a very high piezoelectric charge coefficient d (which quantifies the ability to transform force into electrical charge) and dielectric permittivity, and thus are typically the materials of choice for many piezoelectric devices (e.g., medical ultrasonics for imaging, diagnostics and therapy, underwater acoustics, and ultrasonic motors, etc.). In perovskite ferroelectrics, the piezoelectric coefficient d can be expressed as d=2PSQε (ref. 4), where PS is the spontaneous polarization, Q is the electrostrictive coefficient and ε is the dielectric permittivity. In contrast to Q and PS, ε can be readily tuned for perovskite ferroelectrics; thus, an increase in d is generally associated with an increase in permittivity5,6. From thermodynamic theory, the dielectric permittivity is associated with the curvature of the free-energy density profile of a system with respect to the polarization (2G-P2), where a small curvature (a so-called flat energy profile) corresponds to a high £, consequently leading to a high piezoelectric coefficient d7-10.

Figure 10:
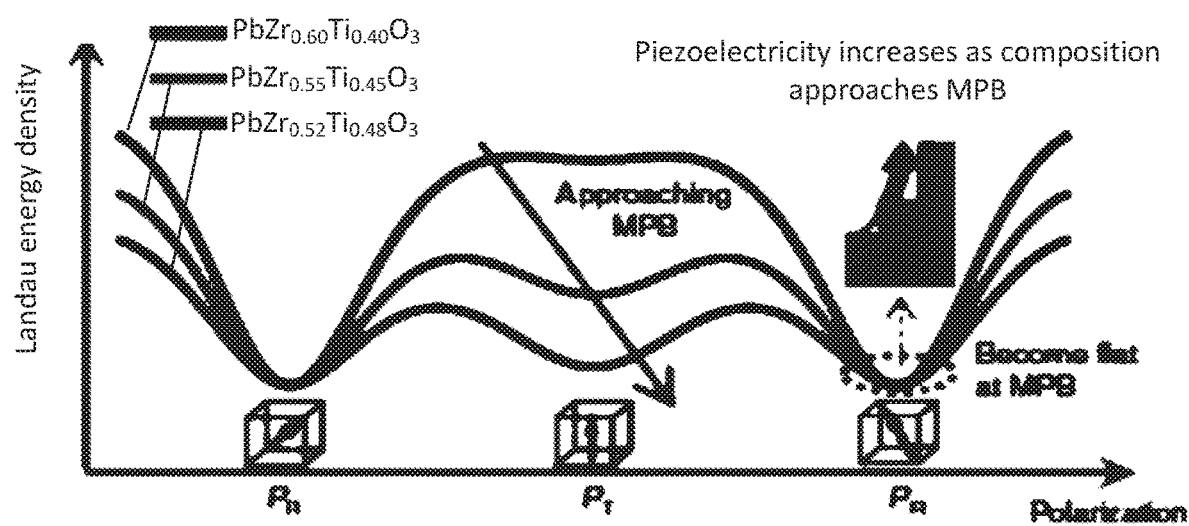
FIG. 10 shows the Landau energy of a homogeneous system, where rhombohedral Pb(Zr,Ti)O3 is shown as an example (polarization variation is plotted on a (110) crystallographic plane). The two PR schematics represent the polarizations along the [111] and [111] directions, respectively, while PT is along the [001] direction. As the composition approaches MPB, the curvature of the energy profile (at the polarization of energy minima (PR)) decreases, leading to increased piezoelectricity.

The thermodynamic energy profile of a ferroelectric solid solution is expected to be flattened when the composition approaches a morphotropic phase boundary (MPB), yielding both drastically enhanced c and d, as depicted in FIG. 10. The traditional approach to achieving a flat energy profile has been to focus on the design of an MPB. However, there is a limit on the piezoelectricity that can be achieved at the MPB compositions. As shown in FIG. 10, it may not be possible to achieve an ideally flat energy profile at the MPB composition in which 2G-P2 approaches zero at the polarization of the energy minima, since the compositionally induced ferroelectric phase transition is first order in nature for most perovskite ferroelectrics. This may be the reason why the piezoelectricity in ferroelectrics has reached a plateau over the years.

Figure 11:
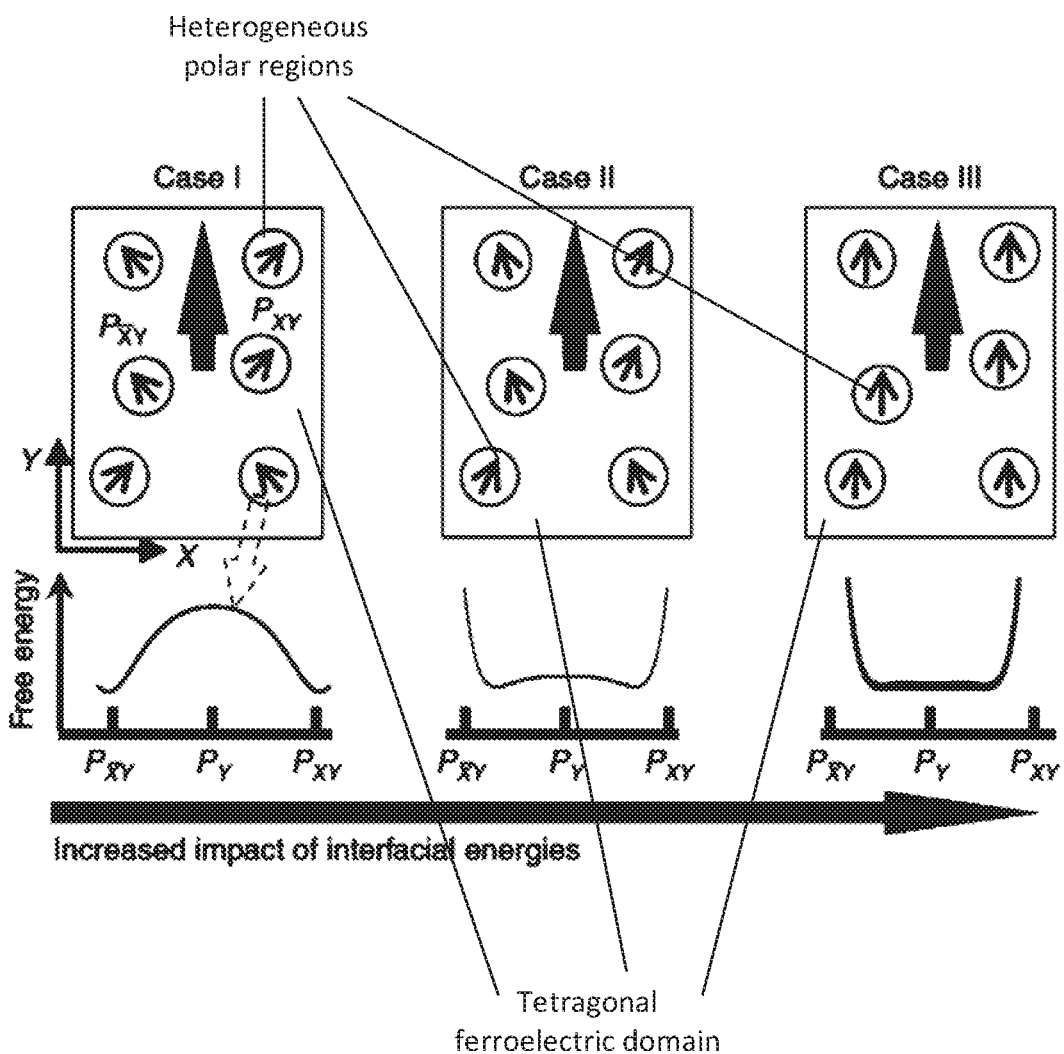
FIG. 11 shows a heterogeneous ferroelectric system, in which heterogeneous polar regions are embedded in a tetragonal ferroelectric domain. The impact of interfacial energies increases from case I to III. In case I, the impact of interfacial energies is minimal. Cases II and III show two possible states for the local regions when the impact of interfacial energies is prominent.

The disclosed methods can flatten the thermodynamic energy profile to enhance the piezoelectricity of perovskite ferroelectrics by utilizing interfacial energies through judiciously introducing local structural heterogeneity. This can be done by using classical relaxor ferroelectrics PMN-PT and $Pb(Zn1/3Nb2/3)O3$-$PbTiO3$ (PZN-PT) crystals and exploiting local structural heterogeneity to enhance the piezoelectricity of ferroelectrics. For example, FIG. 11 shows a tetragonal ferroelectric domain with locally introduced heterogeneous polar regions. In such a system, the bulk energy of those local polar regions, which is related to the local chemical composition, favors the orthorhombic phase (polar vectors along the diagonal PXY_ or PXY direction). Owing to the polarization discontinuity, interfacial energies, including electrostatic, elastic and gradient energies, are present. The interfacial energies favor the transformation of those local regions to the tetragonal state (polar vector along PY), to minimize the polarization discontinuity. Competition between the bulk and interfacial energy may lead to a highly flattened free-energy profile, as shown in cases II and III in FIG. 11. If the impact of these interfacial energies is sufficient, significantly higher piezoelectricity can be realized. For a specific volume fraction of 'local regions', a smaller size corresponds to a higher specific surface area and consequently a higher interfacial energy. Therefore, to achieve effective interfacial energies, nanoscale structural heterogeneity may be a desired result.

Figure 12:
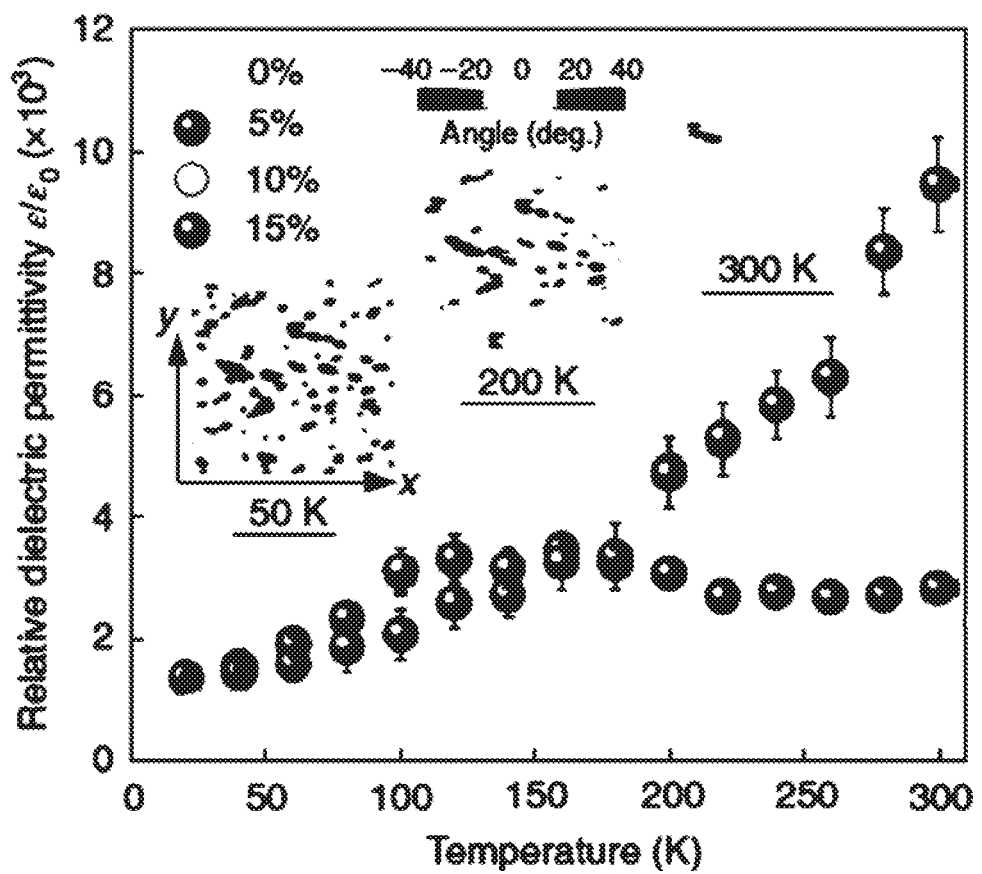
FIG. 12 shows a phase-field simulation of the transverse dielectric permittivities for the heterogeneous system depicted in FIG. 11.
Figure 13:
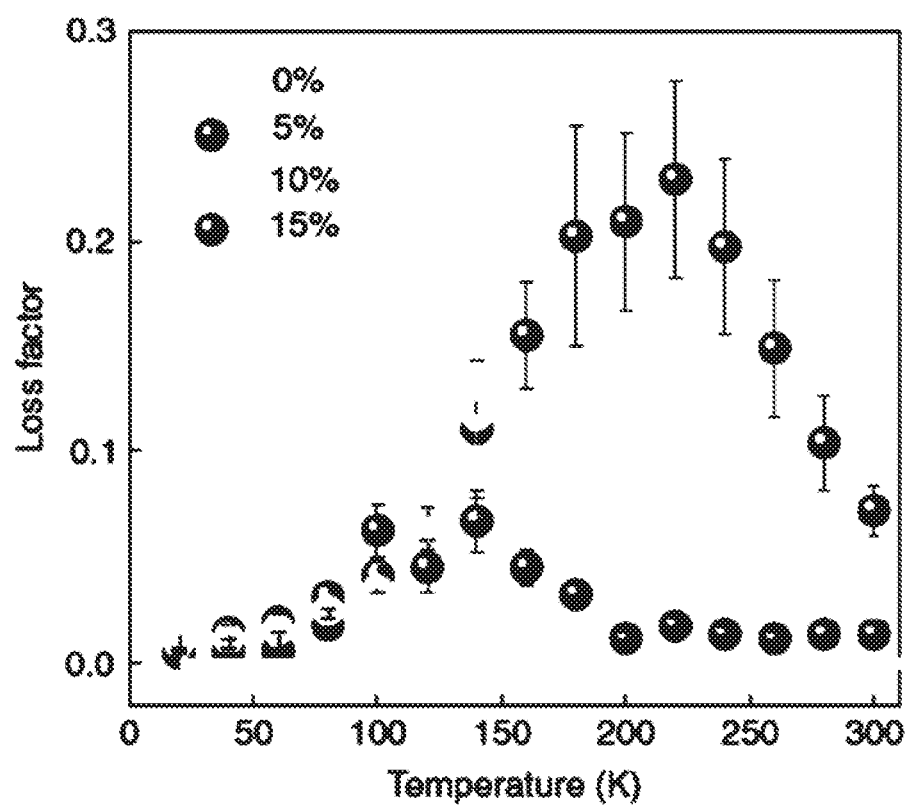
FIG. 13 shows a phase-field simulation of the transverse loss factors for the heterogeneous system depicted in FIG. 11. The volume fractions of the heterogeneous regions are set to be from 0% to 15%. For a specific volume fraction, the error bars represent the standard deviations of the calculated permittivities and losses, which are obtained from five different random distributions of local polar regions. Taking a 10% volume fraction for example, the simulated microstructures are given in the inset of FIG. 11.

Phase-field simulations on the dielectric response of heterogeneous systems depicted in FIG. 11 have been performed. The thermodynamic parameters employed in the simulation are shown in the Technique Used, where the ferroelectric Landau energy (that is, bulk energy) of the locally embedded heterogeneous regions favors an orthorhombic phase. As shown in FIG. 12, when the volume fraction of the local heterogeneous regions is increased, the room-temperature dielectric permittivity is drastically enhanced. At low temperature, the Landau energy well is deep, and thus the impact of the interfacial energies associated with the structural heterogeneity is minimal. With increasing temperature, the Landau energy well becomes shallow, and the impact of the interfacial energies becomes prominent, giving rise to a flattened average thermodynamic energy density profile for the whole heterogeneous system as a function of apparent polarization. Therefore, at elevated temperatures, a system with more heterogeneous regions can exhibit a higher dielectric permittivity. In addition, due to the enhanced impact of the interfacial energies, a higher volume fraction of the tetragonal phase is favored at elevated temperatures (see inset of FIG. 12). FIG. 13 shows the simulated dielectric loss factors with respect to temperature, and reveals a distinctive signature for contributions from the heterogeneous regions to the dielectric response (that is, the enhanced dielectric loss factors at cryogenic temperatures), and a system with a larger volume fraction of heterogeneous regions producing a higher loss maximum. The enhanced loss factor is associated with the polarization switching of heterogeneous regions. As depicted in FIG. 11 (case II), local regions with the polarization of $PXY_-$ may switch their polar vectors to the electric-field-favored polar direction PXY by applying an electric field along the X direction. During this process, energy dissipation is expected since switching between two stable states requires overcoming an energy barrier.

To experimentally test this, PMN-PT was selected, which possesses the highest piezoelectric activity among all binary MPB ferroelectric systems was selected using the nanoscale structural heterogeneity introduced through an embodiment of the doping strategy to, enhanced its piezoelectric responses. Rare-earth dopants can introduce effective random fields/bonds and/or change the ordering degree of B-site cations in Pb-based perovskite ferroelectrics. Therefore, the addition of rare-earth dopants into PMN-PT is considered to be an effective approach to enhance its local structural heterogeneity. The inventors employed low-temperature dielectric experiments by comparing the measured losses with the signatures obtained from phase-field simulations to evaluate the impact of various rare-earth dopants on the local structural heterogeneity in 0.72PMN-0.28PT (PMN-28PT). The inventors down-selected the Sm-PMN-PT system, since this system exhibits the highest loss factor at cryogenic temperatures compared to other doped PMN-PT systems. The inventors synthesized Sm-doped PMN-PT ceramics through high-temperature solid-state processing (see details in the Techniques Used). The Sm-doping concentrations are in the range of 1-3 mol %. The following description will focus on 2.5 mol % Sm-doped 0.71PMN-0.29PT (2.5Sm-PMN-29PT) and 2.5 mol % Sm-doped 0.69PMN-0.31PT (2.5Sm-PMN-31PT) ceramics.

Figure 14:
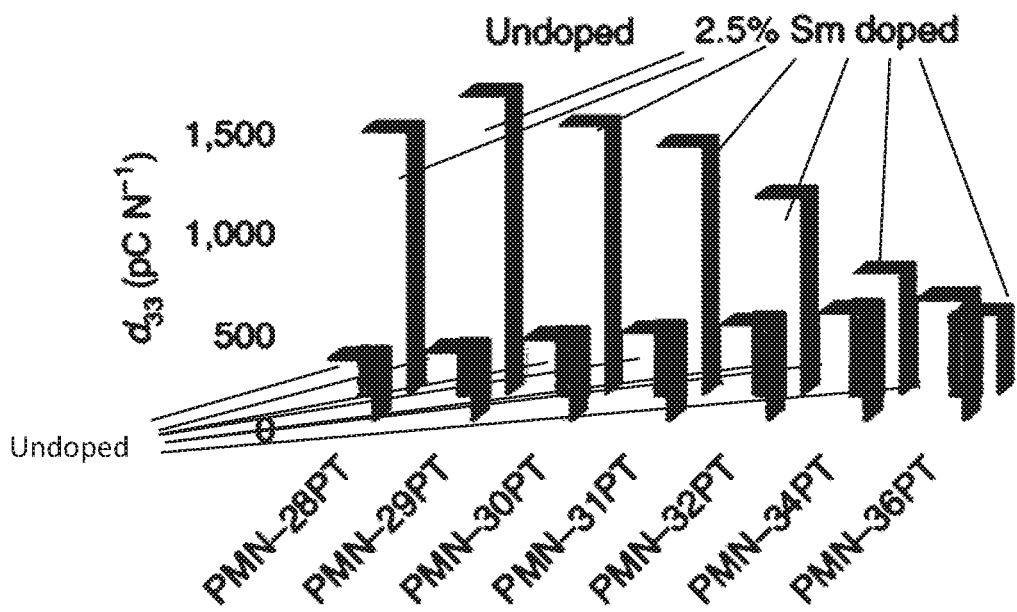
FIG. 14 shows piezoelectric and dielectric properties of an embodiment of a Sm-PMN-PT ceramic, wherein the piezoelectric coefficient d33 of 2.5 mol % Sm-modified PMN-xPT and PMN-xPT ceramics, measured using a Berlincourt d33-meter is achieved.

FIG. 14 shows that the piezoelectric coefficients d33 for the PMN-PT system are significantly enhanced on Sm doping. By adding 2.5 mol % Sm, the pseudocubic-tetragonal phase boundary of PMN-xPT is shifted from the PT content of 0.35 to 0.28. Thus, the maximum piezoelectric response of 2.5 mol % Sm-doped PMN-xPT is observed at x=0.29 on the tetragonal side of the MPB region. An extraordinarily large d33 is observed for 2.5Sm-PMN-29PT ceramics, reaching the order of 1,500 pC N−1—the highest value ever reported in polycrystalline ceramics (to the best of the inventors' knowledge, the previously reported highest d33 was in a Pb(Hf,Ti)O3-Pb(Ni,Nb)O3 (PHT-PNN) system, being on the order of 970 pC N−1), which is significantly higher than that of commercial 'soft' PZT ceramics (for example, PZT5H, PZT5), as shown in Table V.

TABLE V

Comparison of the piezoelectric coefficients and relative dielectric permittivities of the 2.5Sm-PMN-29PT and 2.5Sm-PMN-31PT ceramics with PMN-36PT and conventional 'soft' PZT ceramics

| Ceramic | ε33/ε0 | $d_{33}$ (pC N − 1) |
|---|---|---|
| 2.5Sm-PMN-29PT | 13,000 | 1,510 |
| 2.5Sm-PMN-31PT | 10,000 | 1,250 |
| PMN-36PT | 5,100 | 620 |
| PHT-PNN | 6,000 | 970 |
| Commercial PZT5H | 3,400 | 650 |
| Commercial PZT5 | 1,700 | 500 |

The piezoelectric coefficients d33 are measured by a Berlincourt d33-meter. The errors in the data are within ±5%.

Figure 15:
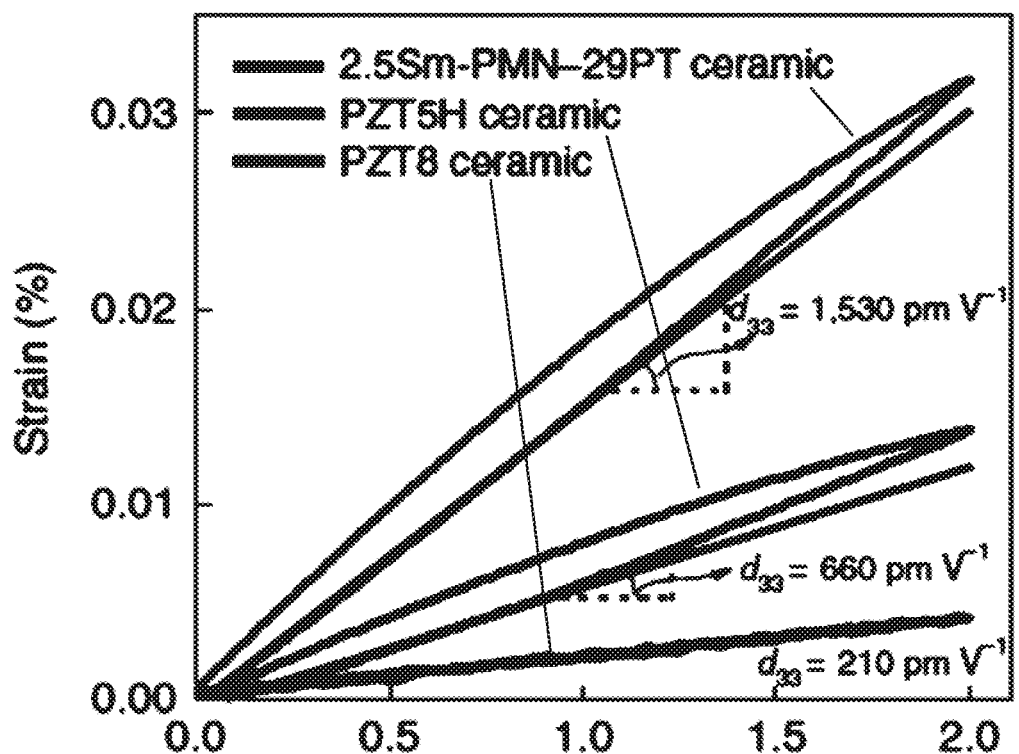
FIG. 15 shows the electric-field-induced strains of an embodiment of a 2.5Sm-PMN-29PT, PZT5H and PZT8 ceramics, measured at 1 Hz.
Figure 16:
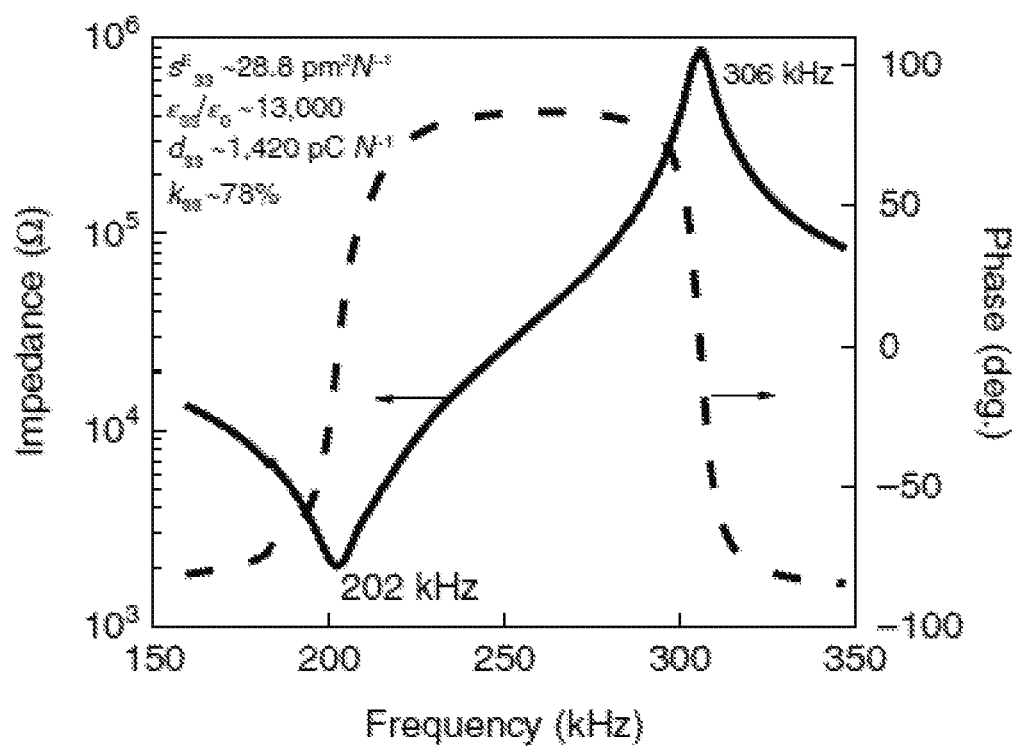
FIG. 16 shows IEEE standard d33 measurements for a longitudinal bar (1.5×1.5×5.5 mm3) of an embodiment of a 2.5Sm-PMN-29PT ceramic.
Figure 17:
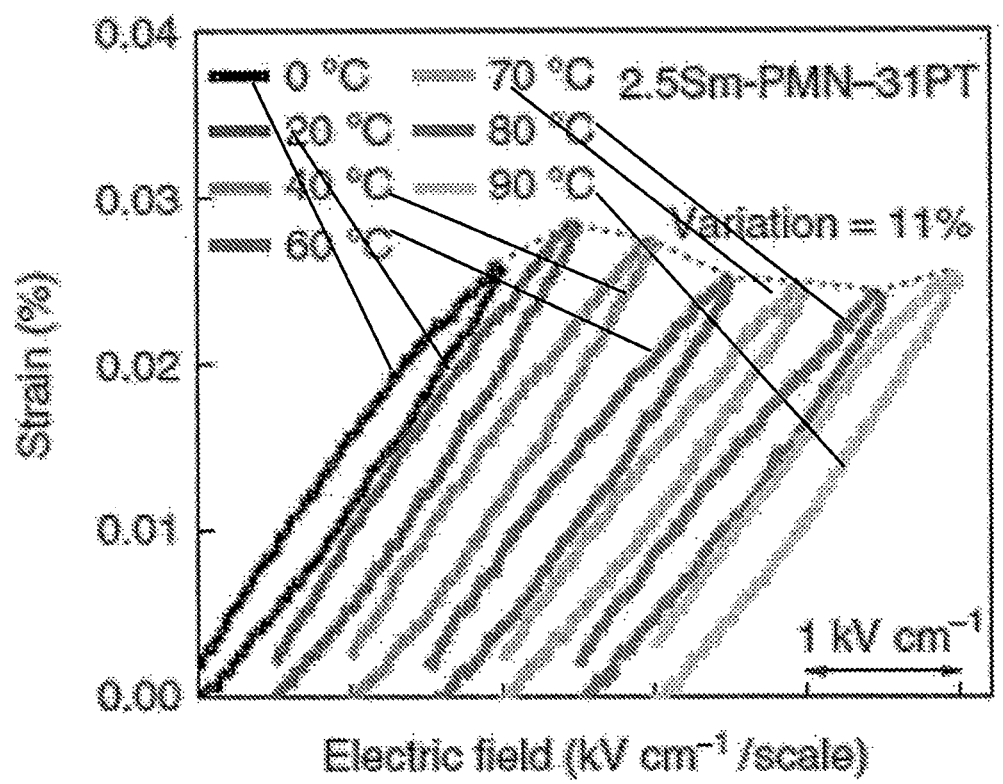
FIG. 17 shows electric-field-induced strains of an embodiment of a 2.5Sm-PMN-31PT at different temperatures. The frequency and amplitude of the electric-field are 1 Hz and 2 kV cm-1, respectively.
Figure 18:
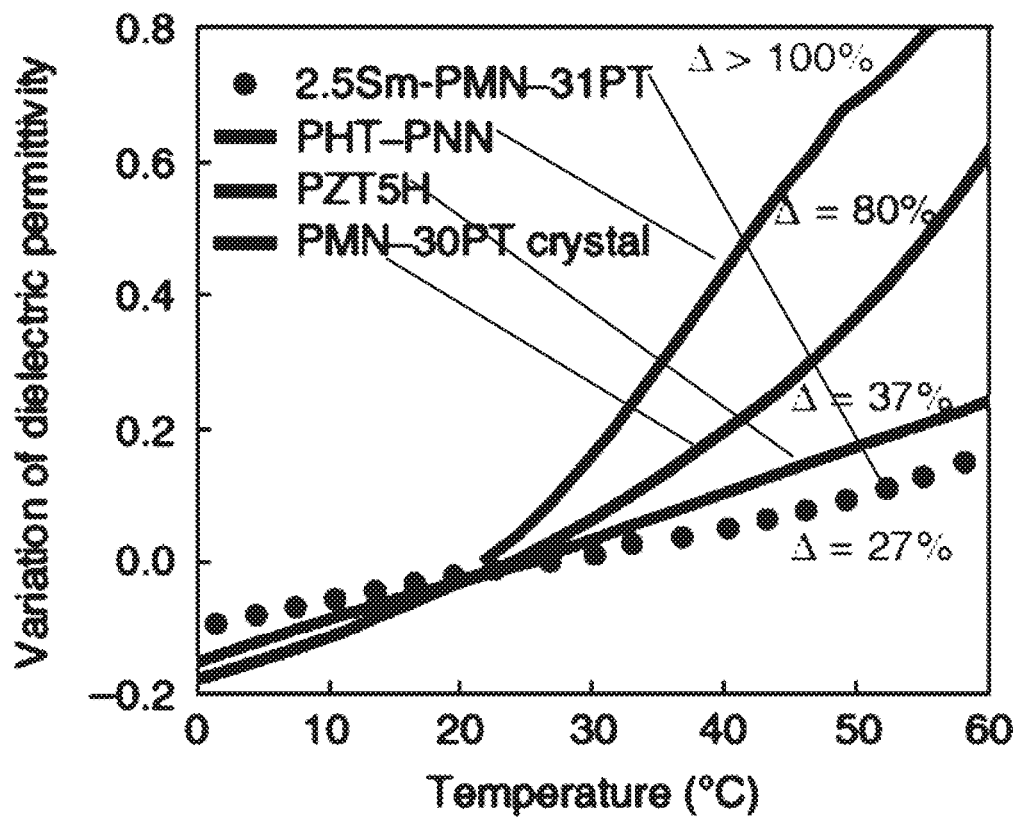
FIG. 18 shows relative variations of the dielectric permittivity with respect to temperature for an embodiment of a 2.5Sm-PMN-31PT ceramic and three conventional piezoelectric materials (that is, the commercial PZT5H ceramic, the [001]-oriented PMN-30PT crystal and the literature-reported PHT-PNN ceramic with d33 of 970 pC N−1).

To verify the large piezoelectric coefficient of 2.5Sm-PMN-29PT ceramics, the inventors employed three different piezoelectric measurements: the Berlincourt method (d33-meter, which is a quasi-static measurement based on the direct piezoelectric effect, with values given in Table V); electric-field induced strain based on converse piezoelectric effect (see FIG. 15); and the electrical impedance method following the IEEE Standard on Piezoelectricity (see FIG. 16). The minimal difference in d33 values measured by the three methods is thought to be associated with the contribution of domain-wall motion, which increases with increasing measurement field amplitude and/or decreasing measurement frequency. Notably, the combination of large piezoelectric coefficient (~1,250 pC N−1) and ultrahigh dielectric permittivity (free dielectric permittivity ~10,000, clamped dielectric permittivity ~3,600), together with a good temperature stability, is achieved in 2.5Sm-PMN-31PT ceramics. As shown in FIG. 17, only a minimal piezoelectric variation of 11% over the temperature range of 0-90° C. is observed. Of particular significance is that the 2.5Sm-PMN-31PT ceramics exhibit improved thermal stability of the dielectric permittivity compared to commercial PZT5H ceramics and PMN-30PT crystals over the temperature range of 0-60° C. (see FIG. 18. All of these merits make the 2.5Sm-PMN-31PT ceramic a promising candidate for numerous electromechanical applications at room temperature, especially for high-frequency transducer arrays, where the ultrahigh clamped dielectric permittivity in 2.5Sm-PMN-31PT ceramic (that is, 3,600, versus PZT5H: 1,400-1,700 and PMN-PT crystals: 800-1,000) can guarantee electrical impedance matching, leading to enhanced sensitivity and broadened bandwidth, thus allowing the miniaturization of transducers.

Figure 19:
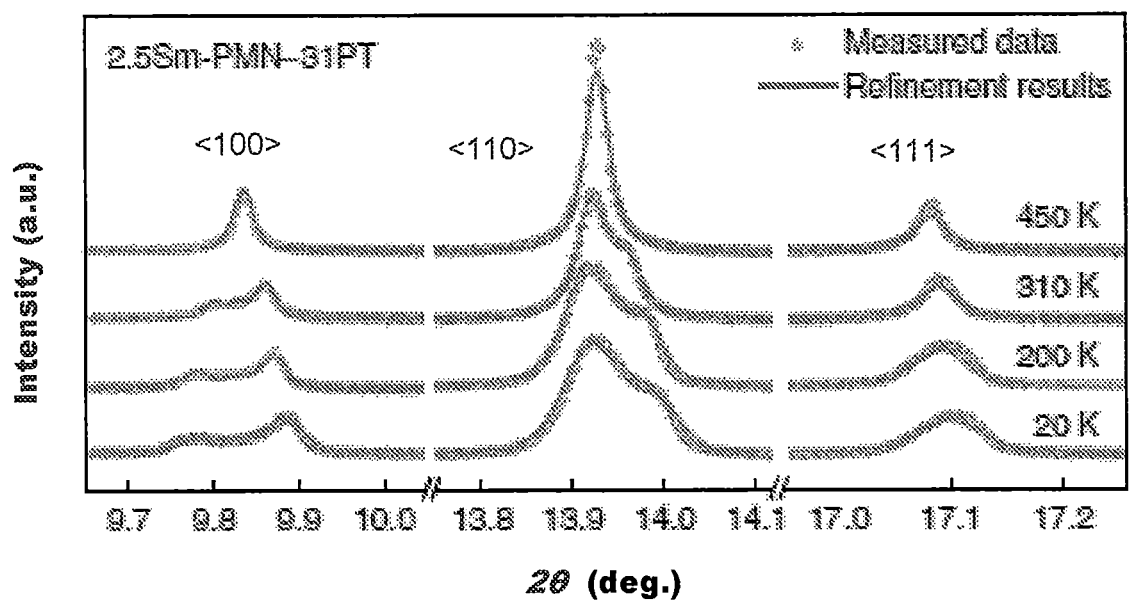
FIG. 19 shows a microstructure of an embodiment of a 2.5Sm-PMN-31PT, wherein synchrotron XRD and refinement results of the <100>, <110> and <111> peaks for 2.5Sm-PMN-31PT powders are shown. Note that 2.5Sm-PMN-31PT is a heterogeneous ferroelectric system, in which considerable lower-symmetry (for example, monoclinic or triclinic) phases may exist due to the presence of random fields, cation order-disorder and interfacial energies. For the Rietveld refinement, after various possibilities had been tried, acceptable fitting results are obtained by approximating 2.5Sm-PMN-31PT as a mixture of tetragonal and orthorhombic phases.
Figure 20:
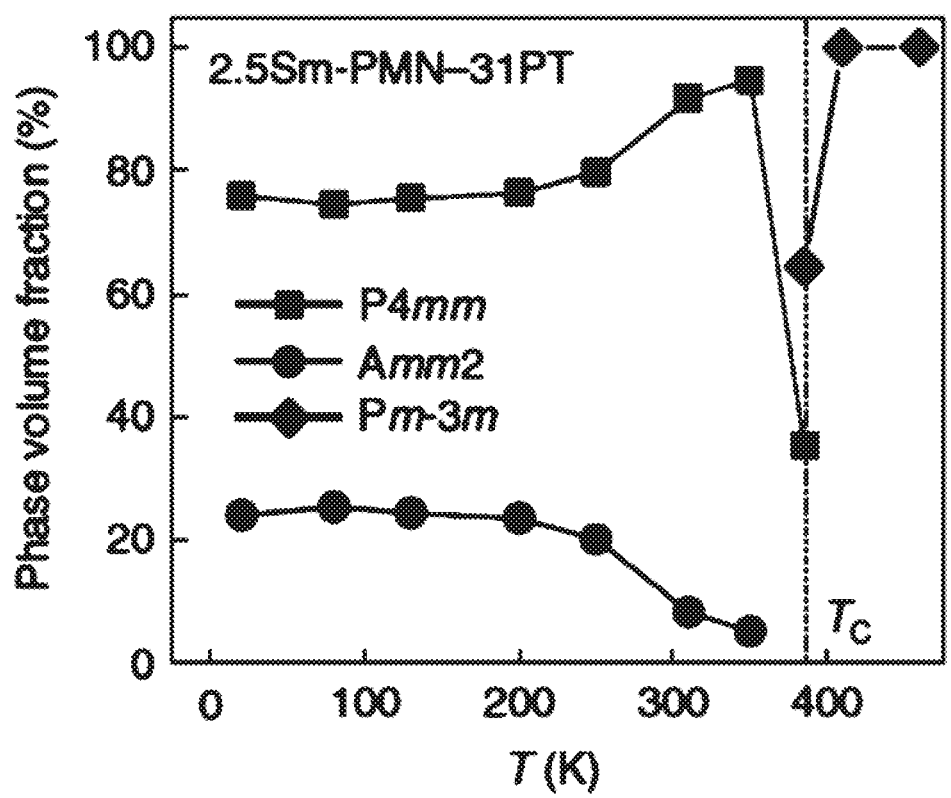
FIG. 20 shows the volume fraction of different phases as a function of temperature (e.g., obtained by Rietveld refinement).

To better understand the underlying mechanism(s) contributing to the high dielectric and piezoelectric properties produced by our method, the microstructures and temperature-dependent dielectric properties for 2.5Sm-PMN-31PT ceramics were investigated. It was found that the impacts of Sm on the density and grain size of the ceramics are minimal; thus, the high dielectric and piezoelectric properties of Sm-doped PMN-PT are not due to the changes in the density and grain size associated with Sm-doping. FIGS. 19-20 show the synchrotron X-ray diffraction (XRD) results for an embodiment of a 2.5Sm-PMN-31PT. Below the Curie temperature (~377 K), the patterns of the three main perovskite diffraction peaks (that is, <100>, <110> and <111>) exhibit minimal variations, indicating that no long-range ferroelectric phase transition occurs over this temperature range. On the basis of Rietveld-refinement analysis, embodiments of a 2.5Sm-PMN-31PT can be approximately treated as a tetragonal phase with a minor orthorhombic component. The volume fraction of the minority orthorhombic phase is found to increase from 8% to 24% as the temperature decreases from 310 K to 200 K, while maintaining almost the same value over the temperature range of 20-200 K.

Figure 21:
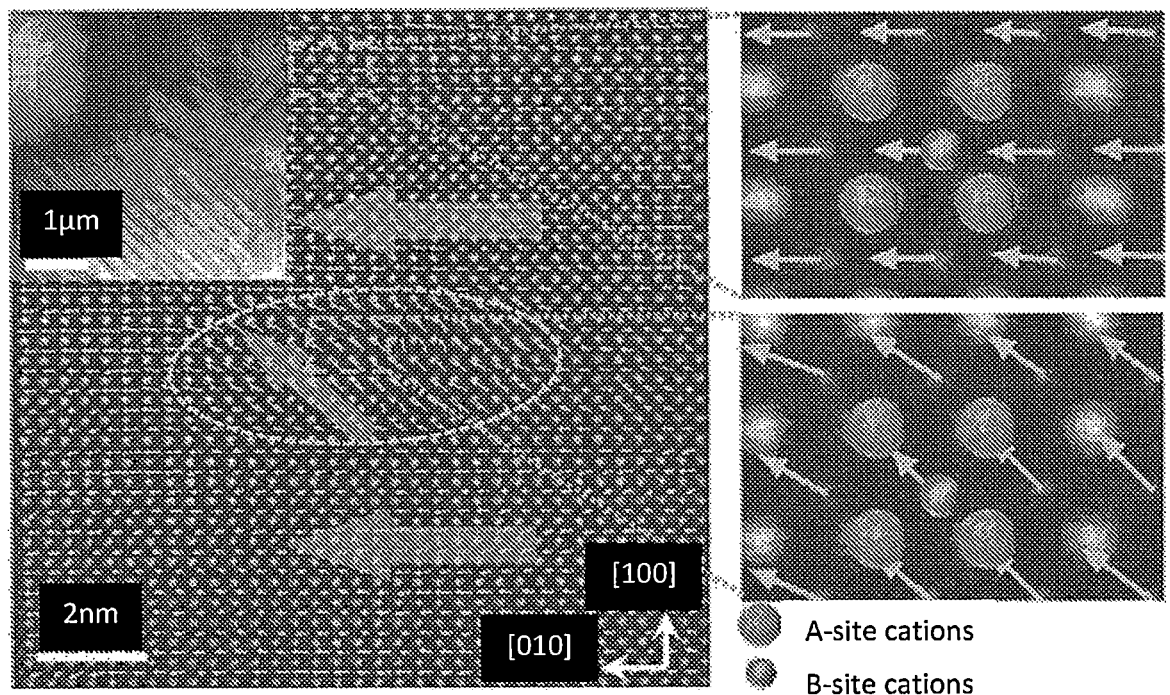
FIG. 21 shows dark-field TEM (upper left corner) and atomic-resolution TEM images at room temperature, recorded along the crystallographic [001] direction. The polar vectors (arrows) are given for each unit-cell column in the atomicresolution TEM. The positions of the A-site and B-site atomic columns are indicated in the enlarged images on the right.

The ferro-electric domain structure of an embodiment of the 2.5Sm-PMN-31PT ceramic is shown in the upper left corner of FIG. 21, indicating a lamellar-type domain configuration with a domain size of 80-300 nm. Further transmission electron microscopy (TEM) experiments show that the impacts of Sm on the domain structure and domain size of PMN-PT ceramics are minimal if the doping does not change the macroscopic crystalline symmetry of the ferroelectric phase, indicating that the ultrahigh piezoelectric properties in Sm-doped PMN-PT ceramics are not attributed to the changes in domain structure induced by Sm-doping. The atomic structure within a tetragonal domain is characterized by high-resolution TEM and given in FIG. 21. The positions of the A-site (Pb/Sm) and B-site (Mg/Nb/Ti) atomic columns are indicated in the enlarged images on the right. According to the positions, the atomic displacements are presented as vectors pointing from the center of a B-site cation to the center of its four nearest neighboring A-site cations. These atomic displacements represent the magnitudes and directions of the polar vectors for each unit-cell column. As shown in FIG. 21, although most polar vectors are along the tetragonal [010] direction, orthorhombic-like nano-regions (polar vector along the [110] direction) are observed in the tetragonal matrix. Here, the TEM and XRD results clearly reveal that 2.5Sm-PMN-31PT is a ferroelectric system with local structural heterogeneity at the nanoscale and is analogous to the schematic picture hypothesized in FIG. 11.

Figure 22:
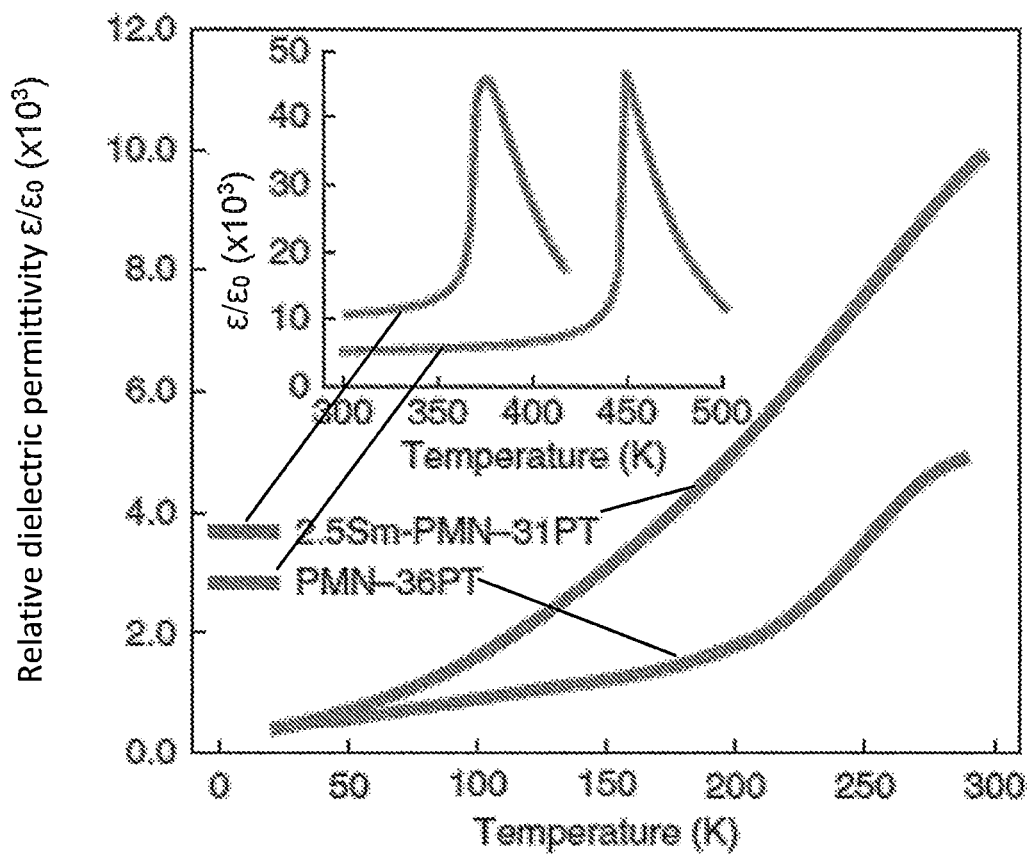
Figure 23:
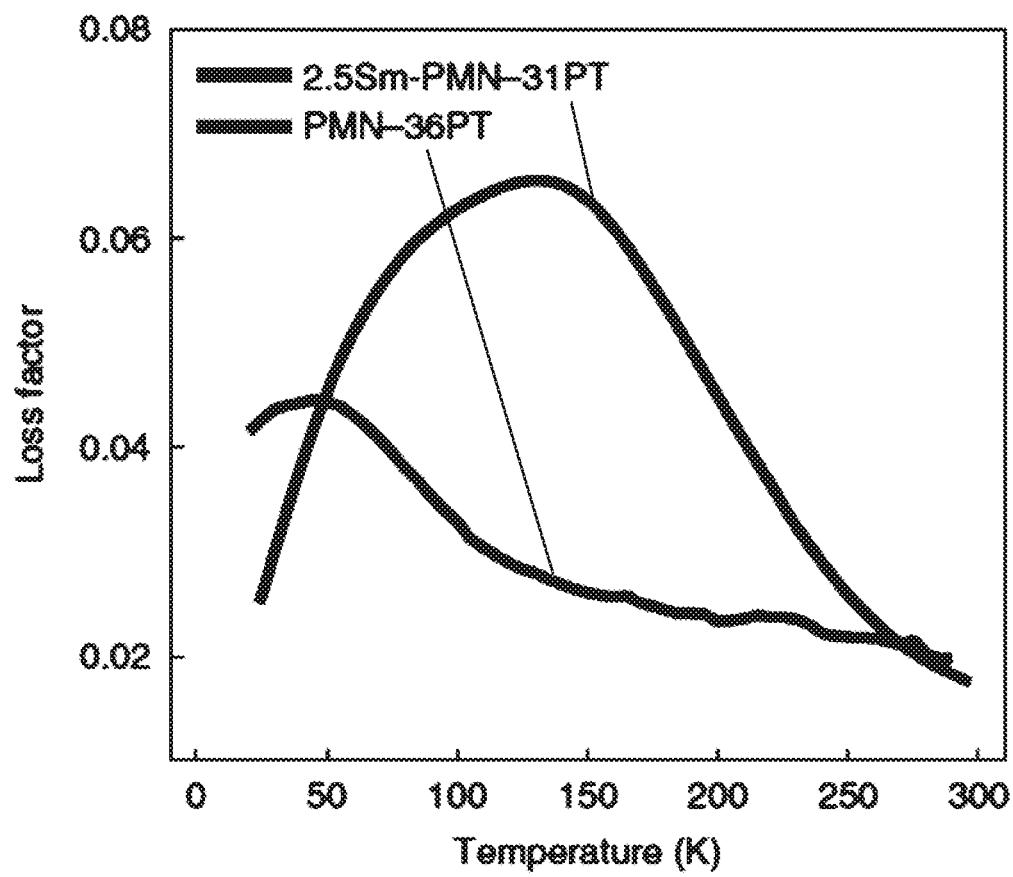

FIGS. 22-23 show the temperature dependence of the dielectric permittivity and loss factor for an embodiment of the 2.5Sm-PMN-31PT ceramic. The PMN-36PT (0.64PMN-0.36PT) ceramic, which exhibits the highest room-temperature dielectric permittivity and piezoelectric coefficient in the PMN-xPT ceramic system, is selected for comparison. The 2.5Sm-PMN-31PT and PMN-36PT ceramics exhibit similar dielectric permittivities at 20 K, while 2.5Sm-PMN-31PT shows a much larger increase in the dielectric permittivity with increasing temperature. The relative dielectric permittivity $\varepsilon/\varepsilon_0$ of 2.5Sm-PMN-31PT is found to be 10,000 at room temperature, which is much higher than that of PMN-36PT (~5,100). In PMN-36PT, a long-range ferroelectric (tetragonal-to-monoclinic) phase transition occurs at about 260 K, which effectively enhances its room-temperature permittivity. Notably, no phase transition occurs in 2.5Sm-PMN-31PT below the Curie temperature, and hence, the high room-temperature dielectric permittivity of 2.5Sm-PMN-31PT cannot be attributed to a ferroelectric phase transition. In addition, as shown in FIG. 23, the maximum dielectric loss factor of 2.5 Sm-PMN-31PT (~6.5%) is greater than that of PMN-36PT (~4.3%). By studying the loss factor with respect to the dopant concentration for Sm-PMN-PT ceramics, the enhanced cryogenic loss factors in 2.5Sm-PMN-31PT are clearly associated with the Sm modification. The phase-transition-unrelated dielectric loss anomaly, which does not exist in classical ferroelectrics such as $Pb(Zr,Ti)O3$, is believed to be associated with the energy dissipation induced by the switching of nanoscale polar regions. On the basis of the simulated results in FIG. 13, a higher loss maximum in 2.5Sm-PMN-31PT indicates a higher volume fraction of heterogeneous polar regions (that is, a higher level of structural heterogeneity). Therefore, the inventors believe that the addition of Sm in PMN-PT creates perturbations in the local order parameters such as polarization and strain, leading to heterogeneous polar regions and additional interfacial energies, including polarization gradient energy, elastic energy and electrostatic energy, when compared to the undoped PMN-PT system. As a result, according to the phenomenological analysis and phase-field simulations presented in FIGS. 11 and 12, these additional energies flatten the averaged free-energy profile of the whole heterogeneous Sm-doped PMN-PT system, thus enhancing the piezoelectric and dielectric properties.

Note that the Curie temperature TC of 2.5 Sm-PMN-31PT is 377 K (see inset of FIG. 22), which is 70 K lower than that of PMN-36PT (TC=445 K). The lower TC of Sm-PMN-31PT may also contribute to the high room-temperature dielectric permittivity; however, it is not the dominant factor. The dielectric permittivities of the 2.5Sm-PMN-31PT and PMN-36PT ceramics with respect to the temperature $\Delta T$ (that is, T−TC) can be compared. At a specific $\Delta T$ (in the ferroelectric phase, that is, $\Delta T<0$), the dielectric permittivity of 2.5Sm-PMN-31PT is >80% higher than that of PMN-36PT, indicating that the TC effect cannot explain the high room-temperature dielectric permittivity of 2.5Sm-PMN-31PT. To experimentally confirm this, the inventors introduced isovalent A-site dopants $Ca2+$ and $Sr2+$ in PMN-31PT, which only decrease the Curie temperature TC but do not introduce additional random fields. As expected, no enhancements in the room-temperature dielectric permittivity and low-temperature dielectric loss are observed in these ceramics, although the TC is decreased to 390 K. From a materials design point of view, it is suggested that a higher degree of local structural heterogeneity may result in a higher room-temperature dielectric permittivity but at the cost of temperature stability, as simulated in FIG. 12. In 2.5Sm-PMN-xPT (x>28), a higher PT content will stabilize the majority tetragonal phase, consequently lowering the degree of structural heterogeneity. Therefore, it is easy to understand that 2.5Sm-PMN-29PT shows a higher room-temperature dielectric permittivity than 2.5Sm-PMN-31PT, while 2.5Sm-PMN-34PT exhibits better temperature stability. This may help guide future material design to achieve specific properties to meet the requirements of different piezoelectric applications.

Methods and systems disclosed herein can successfully address the long-standing challenge in synthesizing new piezoelectric ceramics. The record-high dielectric and piezoelectric properties of the newly designed ceramics can be of practical importance for high-performance electromechanical applications. Methods can involve doping piezoelectric ceramics. Embodiments of the method can include first analyzing the impact of dopants on the local structural heterogeneity for a specific ferroelectric system, to downselect effective dopants by measuring the dielectric loss at cryogenic temperatures, and then in-depth research to focus on the processing and composition optimizations. It should be understood that that although a relaxor-ferroelectric solid solution (PMN-PT) is disclosed and illustrated herein, the methods disclosed to enhance the piezoelectricity by deliberately introducing 'local structural heterogeneity' is not limited to relaxor ferroelectrics. For instance, based on phase-field simulations, an enhanced piezoelectricity can be achieved in PZT superlattices by making use of the interfacial energies between rhombohedral and tetragonal PZT layers. It is expected that tailoring of local structural heterogeneity can be used for optimizing a wide range of functionalities in ferroic materials such as ferromagnetics, ferroelastics and ferroic composites, since many physical properties of a ferroic material are defined by second derivatives of a thermodynamic energy with respect to a certain thermodynamic variable (that is, curvature of free-energy landscape).

Techniques Used

Sample Preparation

A series of $Pb(1-1.5y)Sm_y[(Mg1/3Nb2/3)(1-x)Ti_x]O_3$, with x=0.28-0.36 and y=0-0.03, was synthesized using the B-site cation precursor method. The MgNb2O6 powders were prepared at 1,200° C. for 6 h. The Pb3O4, MgNb2O6, TiO2 and Sm2O3 powders were wet-mixed by ball-milling with Y-stabilized zirconia balls for 24 h, and then the mixed powders were calcined at 850° C. for 2 h. On milling with Rhoplex binder for 12 h, the powders were formed into pellets by uniaxial pressing at 30 MPa, followed by binder burn-out at 550° C. and cold isostatic pressing at 300 MPa. The samples were sintered at 1,170-1,270° C. for 2 h. The average grain size of the samples was found to be around 10 µm. The relative density of the ceramics was measured by the Archimedes method. All ceramics possess high relative densities (>95%). Silver paste (DuPont 6160) was applied on both sides of the samples at 850° C. for 20 min to form the electrodes. For the dielectric and piezoelectric measurements, the samples were poled at 10 kV cm-1 and 20-60° C. for 10 min in silicon oil. All of the samples were characterized at least 24 h after the poling process. As for most of the 'soft' PZT ceramics, ageing is minimal for the Sm-doped PMN-PT ceramics. The variation of dielectric and piezoelectric properties from sample to sample is found to be less than 5%.

Dielectric Measurements

The temperature dependence of the dielectric behavior was determined using an LCR meter (HP4980, Hewlett Packard) connected to a computer-controlled temperature chamber (high temperature: home-made temperature controller; low temperature: Model 325 Cryogenic Temperature Controller, Lake Shore).

Piezoelectric Measurements

The piezoelectric coefficients were determined by a combination of the impedance method (the IEEE Standard on Piezoelectricity), a quasi-static d33-meter (PM300, Piezotest) and electric-field-induced strain. For the resonance method, the impedance spectrum, which was used to determine the resonance and anti-resonance frequencies, was measured using an HP4294 impedance analyzer. The electric-field-induced strain was determined using a linear variable differential transducer driven by a lock-in amplifier (Stanford Research Systems, model SR830).

Synchrotron X-Ray Diffraction (XRD) Measurements

In situ synchrotron XRD experiments were performed at the Powder Diffraction Beamline located at the Australian Synchrotron (λ=0.6885 Å; T=20-450 K). Two sample set-ups were used for this experiment: the cryostat sample set-up for T=20-300 K, in which the samples were mounted in the cryostat within the sample holder (Al capillary); and the borosilicate capillary sample set-up for measurements above 300 K, in which only a small amount (<1 mm deep) of material was loaded into the capillary funnel. The patterns were analyzed using the FULLPROF software Transmission Electron Microscopy (TEM) Experiments Dark-field TEM observations were carried out using a JEOL 2100 microscope operated at 200 kV. High-resolution scanning transmission electron microscopy—high-angle annular dark-field (STEM-HAADF) images were obtained using a JEOL ARM 200 STEM equipped with a cold field-emission gun and a spherical-aberration corrector operated at 200 kV, at the Electron Microscopy Centre of the University of Wollongong. All STEM images were Fourier-filtered using a lattice mask to remove noise. Atomic positions were determined by fitting with two-dimensional Gaussian peaks using the Ranger 2.4 script in Matlab. TEM specimens were prepared using tripod mechanical gliding until thickness fringes were observed at the sample edge. The samples were further milled with 2 keV Ar ions for 20 mins with ±6° incidence angles using a precise ion polishing system. To reduce contamination and the thickness of the damaged layer, the precise ion polishing system was operated at 1 keV for 20 min and 0.5 keV for 30 min with the same incidence angles for a final polishing. The thin areas used for STEM-HAADF imaging were measured to be approximately 20 nm.

Phase-Field Simulations

In the phase-field simulation of a ferroelectric system with local phase fluctuation, the time-dependent Ginzburg-Landau equation was employed to describe the evolution of the polarization, where L is the kinetic coefficient, F is the total free energy of the system, r is the space position and Pi(r, t) is the polarization. $\delta F/\delta P_i(r,t)$ is the thermodynamic driving force for the spatial and temporal evolution of polarization. The total free energy of the system includes the bulk free energy, elastic energy, electrostatic energy and the gradient energy:

$$F=\int_V [f_{bulk}+f_{elas}+f_{elec}+f_{grad}]dV \quad (2)$$

where V is the system volume, fbulk denotes the Landau bulk free-energy density, felas is the elastic energy density, felec is the electrostatic energy density and fgrad is the gradient energy density. The bulk free-energy density is expressed by Landau theory:

$$f_{bulk}=\alpha_1(P_1^2+P_2^2+P_3^2)+\alpha_{11}(P_1^4+P_2^4+P_3^4)+\alpha_{12}(P_1^2P_2^2+P_2^2P_3^2+P_1^2P_3^2)+\alpha_{111}(P_1^6+P_2^6+P_3^6)+\alpha_{112}[P_1^4(P_2^2+P_3^2)+P_2^4(P_1^2+P_3^2)+P_3^4(P_1^2+P_2^2)]+\alpha_{123}P_1^2P_2^2P_3^2 \quad (3)$$

where α1, α11, α12, α111, α112 and α123 are the Landau energy coefficients. In this work, the difference between the tetragonal ferroelectric domain and local heterogeneous polar regions is described by spatially dependent Landau coefficients. An established set of phenomenological parameters of a tetragonal relaxor-PT crystal (PZN-0.15PT) with adjusted Curie temperatures were used in this study. We changed the volume fraction of heterogeneous polar regions to study the corresponding impacts on dielectric behaviours of the heterogeneous system. For the tetragonal domain, the Landau parameters are $\alpha 1=2.38\times10^5$ $(T-410)C^{-2}$ $m^2$ N, $\alpha 11=6.16\times10^7$ $C^{-4}$ $m^6$ N, $\alpha 12=3.37\times10^8$ $C^{-4}$ $m^6$ N, $\alpha 111=3.42\times10^8$ $C^{-6}$ $m^{10}$ N, $\alpha 112=1.02\times10^9$ $C^{-6}$ $m^{10}$ N, and $\alpha 123=-4.84\times10^9$ $C^{-6}$ $m^{10}$ N. For local polar regions, the Landau energy favors the orthorhombic phase, and the corresponding parameters are $\alpha 1=2.2\times10^5$ $(T-560)C^{-2}$ $m^2$ N, $\alpha 11=-2.67\times10^8$ $C^{-4}$ $m^6$ N, $\alpha 12=2.67\times10^8$ $C^{-4}$ $m^6$ N, $\alpha 111=3.33\times10^9$ $C^{-6}$ $m^{10}$ N, $\alpha 112=3.33\times10^8$ $C^{-6}$ $m^{10}$ N, and $\alpha 123=2\times10^{10}$ $C^{-6}$ $m^{10}$ N, where T is the temperature in kelvin. Based on these Landau parameters, the intrinsic dielectric permittivity of the heterogeneous polar regions and the tetragonal matrix are ~700 and ~2,000, respectively, at 300 K. The parameters in the elastic, electrostatic and gradient energy density are assumed to be uniform throughout the system. In the simulations, the inventors employed two-dimensional 128×128 discrete grid points and periodic boundary conditions. The grid space in real space was _x=_y=1 nm. The size of the local polar regions was set to 3-6 nm with random distribution. The volume fraction of the local regions was set in the range of 0-15%. To calculate the dielectric properties, an a.c. electric field was applied to the system, and the corresponding polarization was recorded at each time step. The amplitude of the a.c. field was 105 V m−1. For a tetragonal domain, there are two independent dielectric permittivities, that is, transverse dielectric permittivity ε11 (measured perpendicular to the polar direction) and longitudinal dielectric permittivity ε33 (measured along the polar direction). Both contribute to the dielectric permittivity of a polycrystalline ceramic. For a composition in proximity of the MPB, ε11 is generally much larger than ε33 and is the dominant factor for the apparent permittivity of ceramics. Furthermore, in this heterogeneous system, it was found that ε33 is insensitive to the heterogeneous polar regions. Therefore, the calculated dielectric permittivity shown in FIG. 12 is ε11. For a specific volume fraction, standard deviations of the calculated permittivities and loss factors were obtained from five different random distributions of local polar regions.

FIG. 24 shows an exemplary method for generating a piezoelectric system. The piezoelectric polycrystalline ceramic materials can be generated by high temperature solid state sintering method. The method can include preparing a ferroelectric polycrystalline ceramic material having a Pervoskite crystalline structure. In some the embodiments, the ferroelectric material may be configured as a relaxor-based ferroelectric material. In some embodiments, the relaxor-based ferroelectric material may be configured as a relaxor-based ferroelectric solid solution crystal. In some the embodiments, the relaxor-based ferroelectric material may be a ceramic. In some embodiments, the relaxor-based ferroelectric material may be configured to include a Pb(MI, MIIB'B")O3 with Pervoskite structure.

The method can include ensuring the temperature of the ferroelectric material is above the Burns temperature so as to generate at least one randomly orientated PNR. In some embodiments, the ferroelectric material can include at least one of a rhombohedral and/or a tetragonal ferroelectric phase. At least one PNR may be formed in, at, or near, at least one of the rhombohedral phase region and the tetragonal ferroelectric phase region.

The method can include applying a polarization treatment to the ferroelectric material. The may be done to provide the ferroelectric material with a polarity.

The method can include modifying the size and/or volume of at least one PNR. This can include modifying the size and/or volume via at least one composition modification. In some embodiments, the composition modification can be achieved via doping the ferroelectric material with at least one additive. In some embodiments, the doping can occur at the A-site and/or the B-site. The doping may be done to generate local structure distortion and/or volume fractioning at or near the at least one of PNR. This may include causing volume fractioning of a PNR located at, in, or near a tetragonal phase. In some embodiments, the doping can cause the PNR to form a collinear state with an adjacent matrix of the ferroelectric material.

In some embodiments, the ferroelectric material can be configured as a binary and/or ternary system.

Figure 25:
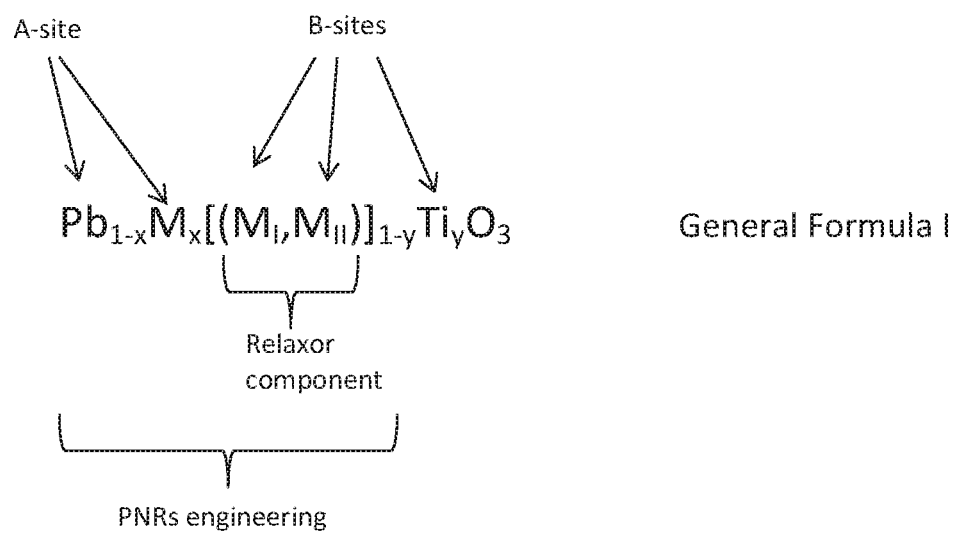
FIG. 25 shows exemplary general formulas that may be used for generating an embodiment of the material.
Figure 25:
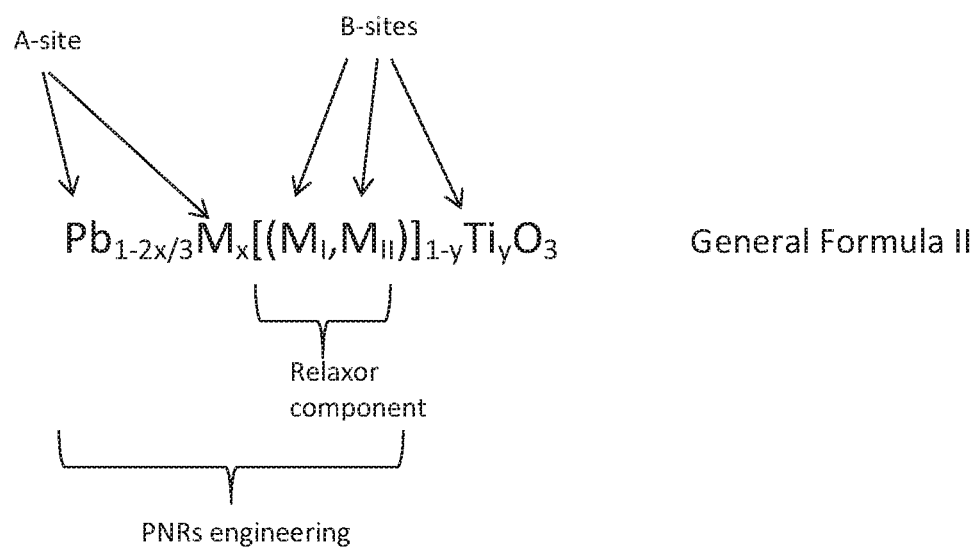

FIG. 25 shows exemplary general formulas that may be used for generating an embodiment of the material. A Pervoskite crystalline structure can include a general chemical formula of XIIA2+VIB4+X2-3, where A and B may be cations and X may be oxygen. An exemplary Perovskite ceramic can be lead titanate (PbTiO3), for example. The lattice structure of a Perovskite material can include cubic, orthorhombic, tetragonal, trigonal, etc. The oxygen may be located at the face centers of the lattice. Coordination numbers between the A ions and its neighbor atoms, coordination numbers between the B ions and its neighbors, and/or the size of the A and/or B ions can be changed or controlled to generate distortions and/or introduce stability in the crystalline structure.

Referring to FIG. 25, some embodiments of the material may be configured to include a relaxor-based ferroelectric structure. This may include an ABO3 Perovskite structure, where the ABO3 can be an end member to a compound having a Perovskite structure. "A" may be referred to as the A-site cation. "B" may be referred to as the B-site cation. An example can be a relaxor-lead titanate based ferroelectric structure, which may have a general formula of Pb(MI,MII)O3-PbTiO3. Pb(MI,MII)O3 may be referred to as a relaxor end member. As explained in detail herein, the inventive method can be used to generate other formulations. For example, a general formula of embodiments of the material can include Pb1-xMx[(MI,MII)]1-yTiyO3 ("General Formula I") and/or Pb1-2x/3Mx[(MI,MII)] 1-yTiyO3 ("General Formula II"). In the general formulas, Pb can be referred to as A-site. (MI,MII) and/or Ti can be referred to as B-sites. The MI may be a low valance cation. The MII may be a high valance cation.

The (MI,MII) portion may generate a relaxor component. Relaxor components can include polarized nanoregions (PNRs). PNRs can be formed by causing a nanoscale local region to have a dominant structure with spontaneous polarizations different from a nearby matrix of the material. The spontaneous polarization regions may be with a range from several nanometers to several tens nanometers. Exemplary materials with PNRs may include lead lanthanum zirconate titanate (PLZT), lead magnesium niobate (PMN), lead zinc niobate (PZN), PMN-lead titanate (PbTiO3) solid solution, lead barium metaniobate (PBN), Na1/2Bi1/2O3 (NBT), etc.

It should also be appreciated that some components, features, and/or configurations may be described in connection with only one particular embodiment, but these same components, features, and/or configurations can be applied or used with many other embodiments and should be considered applicable to the other embodiments, unless stated otherwise or unless such a component, feature, and/or configuration is technically impossible to use with the other embodiment. Thus, the components, features, and/or configurations of the various embodiments can be combined together in any manner and such combinations are expressly contemplated and disclosed by this statement. Thus, while certain exemplary embodiments of the piezoelectric system, ferroelectric polycrystalline material systems, and methods of making and using the same have been shown and described above, it is to be distinctly understood that the invention is not limited thereto but may be otherwise variously embodied and practiced within the scope of the following claims.

We claim:

1. A method for generating a piezoelectric system, the method comprising:
    preparing a ferroelectric polycrystalline material having a perovskite crystalline structure having at least one end member, the ferroelectric polycrystalline material including a Pb($M_I$,$M_{II}$)$O_3$ perovskite structure represented by a general formula $Pb_{1-x}M_x[(M_I,M_{II})]_{1-y}Ti_yO_3$ and/or $Pb_{1-2x/3}M_x[(M_I,M_{II})]_{1-y}Ti_yO_3$; wherein:
    M comprises at least one of $La^{3+}$, $Ce^{3+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, $Lu^{3+}$;
    $M_I$ comprises at least one of $Mg^{2+}$, $Zn^{2+}$, $Ni^{3+}$, $Yb^{3+}$, $Sc^{3+}$, $In^{3+}$, $Co^{3+}$, $Fe^{3+}$, $Ga^{3+}$; and $M_{II}$ comprises at least one of $Ti^{4+}$, $Zr^{4+}$, $Hf^{4+}$, $Sn^{4+}$, $Nb^{5+}$, $Ta^{5+}$, $W^{6+}$;

ensuring the at least one of end member comprises a relaxor component with a polarized nanoregion (PNR) by keeping differences in size and valence between $M_I$ and $M_{II}$ so as to generate at least one randomly orientated PNR while applying a polarization treatment to the ferroelectric polycrystalline material; and modifying size and volume of the PNR via composition modifications by doping the ferroelectric polycrystalline material at an A-site and/or a B-site of the $Pb(M_I,M_{II})O_3$ Perovskite structure;

wherein:
0<x<0.05; and
0.02<y<0.7.

2. The method recited in claim 1, wherein the preparing the ferroelectric polycrystalline material comprises preparing at least one of a binary and ternary ferroelectric material systems.

3. The method recited in claim 1, wherein the preparing the ferroelectric polycrystalline material comprises preparing a relaxor-based ferroelectric material including a general formula $(Pb,Bi)_{1-x}M_x[(M_I,M_{II})O_3]_{1-y}Ti_yO_3$, wherein:
0<x<0.05, and
0.02<y<0.7.

4. The method recited in claim 1, wherein the piezoelectric system has a free dielectric constant >7,000, a clamped dielectric constant ≥2,500, a piezoelectric coefficient $d_{33}$≥1000 pC/N, and coupling factor $k_{33}$=0.76~0.80.

5. The method recited in claim 1, wherein the piezoelectric system has a piezoelectric coefficient $d_{33}$≥1500 pC/N.

6. The method recited in claim 1, wherein the piezoelectric system has a piezoelectric coefficient $d_{33}$≥1100 pC/N, a free dielectric constant >10000, a coupling factor $k_{33}$≥0.78, and a phase transition temperature >80° C.

7. The method recited in claim 1, wherein the piezoelectric system has an electric field induced piezoelectric coefficient $d_{33}^*$≥1200 pC/N at an applied electric field >2 kV/cm.

8. The method recited in claim 1, further comprising causing the PNR to form a collinear state with an adjacent matrix of the ferroelectric polycrystalline material.

9. The method recited in claim 1, further comprising making use of the interfacial energies between rhombohedral and tetragonal PZT layers to enhanced piezoelectricity in PZT superlattices of the ferroelectric polycrystalline material.

10. The method recited in claim 1, wherein the preparing the ferroelectric polycrystalline material comprises preparing a ferroelectric ceramic.

11. The method recited in claim 1, wherein the preparing the ferroelectric polycrystalline material comprises preparing a ferroelectric polycrystalline material including at least one of a rhombohedral and/or a tetragonal ferroelectric phase.

12. The method recited in claim 11, further comprising generating of the PNR so that at least one PNR is formed in, at, or near, at least one of the rhombohedral phase region and the tetragonal ferroelectric phase region.

* * * * *